(12) United States Patent
Ishizuki et al.

(10) Patent No.: US 9,214,361 B2
(45) Date of Patent: *Dec. 15, 2015

(54) SEMICONDUCTOR DEVICE MANUFACTURING METHOD AND ELECTRONIC DEVICE MANUFACTURING METHOD

(71) Applicant: FUJITSU LIMITED, Kawasaki-shi, Kanagawa (JP)

(72) Inventors: Yoshikatsu Ishizuki, Yokohama (JP); Shinya Sasaki, Ebina (JP); Motoaki Tani, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 80 days.

This patent is subject to a terminal disclaimer.

(21) Appl. No.: 13/749,126

(22) Filed: Jan. 24, 2013

(65) Prior Publication Data
US 2013/0217184 A1 Aug. 22, 2013

(30) Foreign Application Priority Data
Feb. 17, 2012 (JP) .................................. 2012-032677

(51) Int. Cl.
*H01L 21/00* (2006.01)
*H01L 21/56* (2006.01)
(Continued)

(52) U.S. Cl.
CPC .............. *H01L 21/56* (2013.01); *H01L 21/568* (2013.01); *H01L 21/6835* (2013.01); *H01L 24/19* (2013.01); *H01L 24/20* (2013.01); *H01L 24/96* (2013.01); *H01L 21/561* (2013.01); *H01L 23/3128* (2013.01); *H01L 2221/6834* (2013.01); *H01L 2221/68327* (2013.01);
(Continued)

(58) Field of Classification Search
USPC .......................................................... 156/706
See application file for complete search history.

(56) References Cited

U.S. PATENT DOCUMENTS

| 5,915,170 A | 6/1999 | Raab et al. |
| 7,112,467 B2 | 9/2006 | Eichelberger et al. |

(Continued)

FOREIGN PATENT DOCUMENTS

| CN | 102097341 A | 6/2011 |
| CN | 102134453 A | 7/2011 |

(Continued)

OTHER PUBLICATIONS

Office Action of corresponding Taiwanese Patent Application No. 102104345 dated Jul. 14, 2015. Full Translation of the Office Action.

(Continued)

*Primary Examiner* — Reema Patel
(74) *Attorney, Agent, or Firm* — Kratz, Quintos & Hanson, LLP

(57) ABSTRACT

A method of manufacturing a semiconductor device, includes: placing a semiconductor element on an adhesive layer that is placed on a support body having a first through hole; placing a part in an area that includes a portion corresponding to the first through-hole, the portion being on the adhesive layer placed on the support body; forming a substrate on the adhesive layer by forming a resin layer on the adhesive layer, on which the semiconductor element and the part have been placed, the substrate including the semiconductor element, the part, and the resin layer; and detaching the substrate from the adhesive layer by pressing the part through the first through-hole.

5 Claims, 23 Drawing Sheets

(51) Int. Cl.
*H01L 23/00* (2006.01)
*H01L 21/683* (2006.01)
*H01L 23/31* (2006.01)

(52) U.S. Cl.
CPC ............ *H01L 2221/68381* (2013.01); *H01L 2224/04105* (2013.01); *H01L 2224/12105* (2013.01); *H01L 2224/16225* (2013.01); *H01L 2224/24195* (2013.01); *H01L 2924/19105* (2013.01)

(56) References Cited

U.S. PATENT DOCUMENTS

| | | | |
|---|---|---|---|
| 7,163,843 | B2 | 1/2007 | Kiendl et al. |
| 7,202,107 | B2 | 4/2007 | Fuergut |
| 7,943,423 | B2 | 5/2011 | Pohl et al. |
| 8,860,211 | B2 | 10/2014 | Kon |
| 2002/0011655 | A1 | 1/2002 | Nishiyama |
| 2003/0017663 | A1 | 1/2003 | Takyu |
| 2005/0230776 | A1 | 10/2005 | Kountz et al. |
| 2006/0128063 | A1 | 6/2006 | Yamano |
| 2006/0183269 | A1 | 8/2006 | Fuergut |
| 2007/0145555 | A1 | 6/2007 | Fuergut et al. |
| 2007/0218651 | A1 | 9/2007 | Higashino |
| 2009/0039496 | A1 | 2/2009 | Beer et al. |
| 2010/0195299 | A1 | 8/2010 | Souriau et al. |
| 2011/0143501 | A1 | 6/2011 | Oda et al. |
| 2011/0143552 | A1 | 6/2011 | Yanagi et al. |
| 2011/0151625 | A1 | 6/2011 | Hoshino et al. |
| 2011/0215461 | A1 | 9/2011 | Iijima |
| 2013/0217189 | A1* | 8/2013 | Sasaki et al. .................. 438/118 |

FOREIGN PATENT DOCUMENTS

| | | |
|---|---|---|
| JP | 2001-308116 A1 | 11/2001 |
| JP | 2002-124527 A1 | 4/2002 |
| JP | 2002299500 A1 | 10/2002 |
| JP | 2003-17513 A1 | 1/2003 |
| JP | 4403631 B2 | 1/2010 |
| JP | 2011-187551 A1 | 9/2011 |
| TW | 546813 B | 8/2003 |
| TW | 201130945 A1 | 9/2011 |
| TW | 201140709 A | 11/2011 |

OTHER PUBLICATIONS

Office Action of U.S. Appl. No. 13/749,159 dated Jul. 22, 2015.
Chinese Office Action for CN Application No. 201310048766.2, mailed Apr. 3, 2015, with full translation. Cited in IDS filed Jun. 15, 2015 for U.S. Appl. No. 13/749,159.
Office Action of Taiwanese Patent Application No. 102104165 dated Dec. 23, 2014, with full translation, Cited in IDS filed Mar. 6, 2015 for U.S. Appl. No. 13/749,159.
Office Action of U.S. Appl. No. 13/749,159 dated Feb. 25, 2015.
Office Action of U.S. Appl. No. 13/749,159 dated Nov. 5, 2014.

* cited by examiner

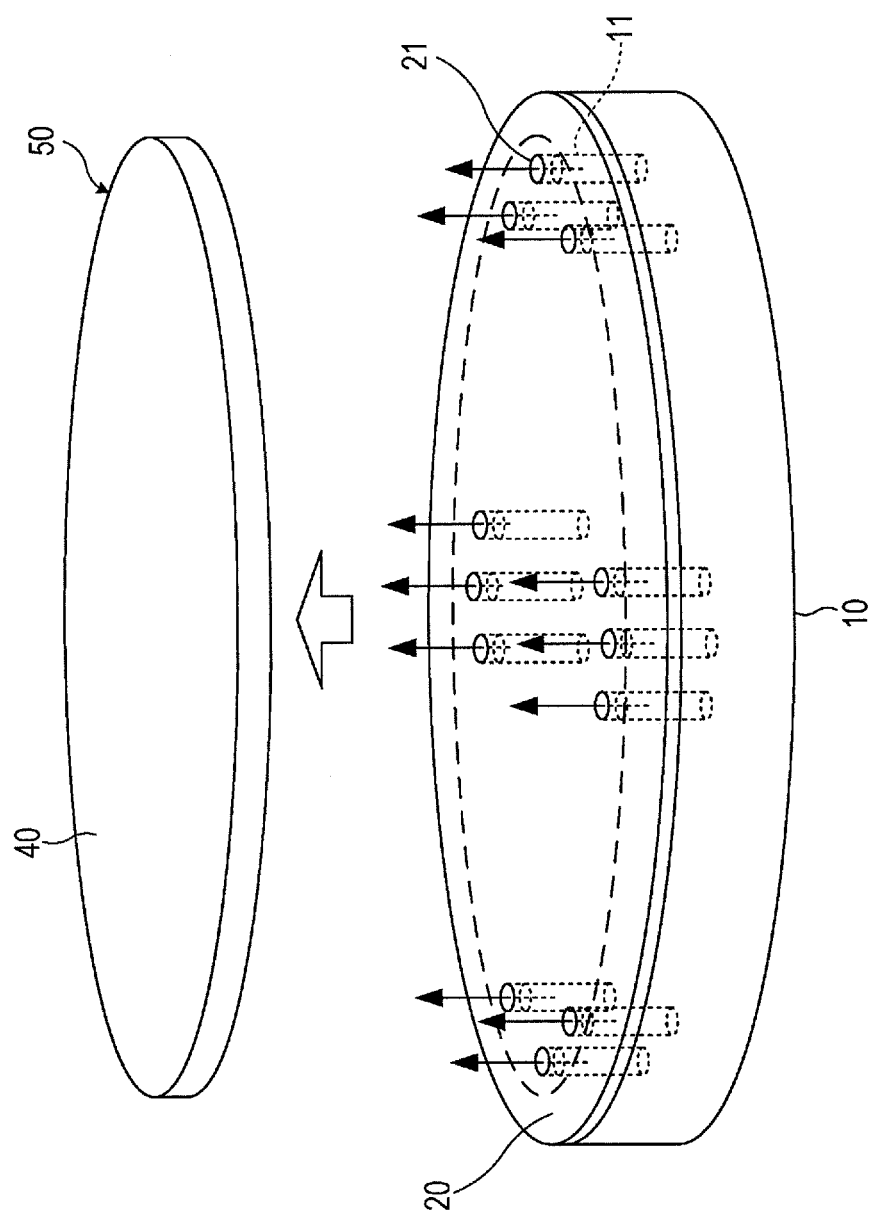

SEMICONDUCTOR DEVICE MANUFACTURING METHOD AND ELECTRONIC DEVICE MANUFACTURING METHOD

CROSS-REFERENCE TO RELATED APPLICATION(S)

This application is based upon and claims the benefit of priority of the prior Japanese Patent Application No. 2012-032677, filed on Feb. 17, 2012, the entire contents of which are incorporated herein by reference.

FIELD

The embodiments discussed herein are related to a method of manufacturing semiconductor devices including semiconductor elements and a method of manufacturing electronic devices including the semiconductor devices.

BACKGROUND

A wafer-level package (WLP) is known as one of the semiconductor packages (semiconductor devices) including semiconductor elements (electronic parts) such bare chips. The WLP may also be referred to as the wafer-level chip size package (WL-CSP) or wafer chip size package (W-CSP). With the WLP, terminals at an end of a bare chip can be relocated in the chip area, that is, fan-in design is possible. Since a bare chip has had more terminals, it has become difficult to relocate its terminals only in the chip area. To address this problem, a WLP that has terminals relocated outside the chip area, that is, that has a fan-out structure, has also been developed.

In the manufacturing these types of semiconductor packages, a known technology uses a method in which a semiconductor element is attached onto an adhesive player, such as an adhesive sheet, disposed on a support body, the semiconductor element is sealed by a resin to form a pseudo wafer, and the pseudo wafer is detached from the adhesive layer. Then, a wiring layer is formed on a surface, of the pseudo wafer, that has been detached from the adhesive layer, after which dicing is performed to obtain individualized semiconductor packages. In this type of manufacturing method, when the pseudo wafer is detached from the adhesive layer, the adhesive force of the adhesive layer is lowered by, for example, irradiation with ultraviolet rays, treatment with a chemical solution, or heating.

In a conventional known technology, when an individualized chip attached onto an adhesive layer such as a film or a tape is detached from the adhesive layer, the chip is pushed upward with a pin from below the adhesive layer.

Examples disclosed as related art include, for example, the description in U.S. Pat. No. 7,202,107B2, Japanese Patent No. 4403631, and Japanese Laid-open Patent Publication Nos. 2002-124527, 2011-187551, and 2003-17513.

In the method described above, in which a pseudo wafer (substrate) formed on an adhesive layer is detached from the adhesive layer, the adhesive force of the adhesive layer is lowered by irradiation with ultraviolet rays, treatment with a chemical solution, or heating.

Once the adhesive force of the adhesive layer has been lowered, however, it is difficult to reuse the adhesive layer. Therefore, a new adhesive layer has been used each time a pseudo wafer is formed.

This has been an obstacle to reductions in person-hours and costs involved in the manufacturing of semiconductor devices (semiconductor packages). There has been also the possibility that the use of semiconductor devices manufactured in this way may increase the costs of electronic devices.

SUMMARY

According to an aspect of the invention, a method of manufacturing a semiconductor device, includes: placing a semiconductor element on an adhesive layer that is placed on a support body having a first through hole; placing a part in an area that includes a portion corresponding to the first through-hole, the portion being on the adhesive layer placed on the support body; forming a substrate on the adhesive layer by forming a resin layer on the adhesive layer, on which the semiconductor element and the part have been placed, the substrate including the semiconductor element, the part, and the resin layer; and detaching the substrate from the adhesive layer by pressing the part through the first through-hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 illustrates a semiconductor device manufacturing process;

DESCRIPTION OF EMBODIMENTS

Figure 1A:
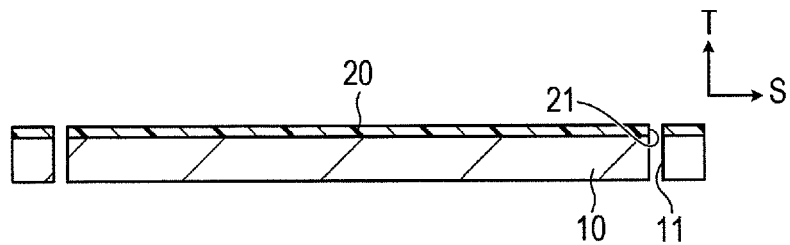
FIGS. 1A to 1D illustrate an example of a method of manufacturing semiconductor devices.
Figure 1B:
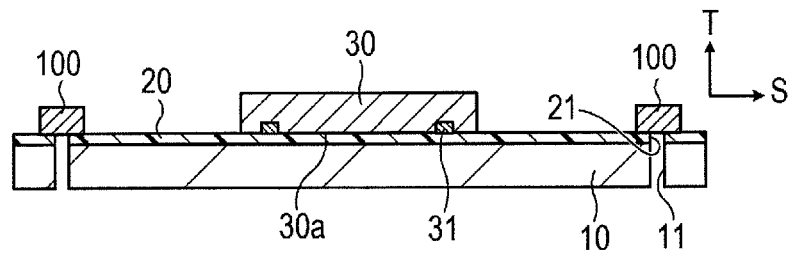
Figure 1C:
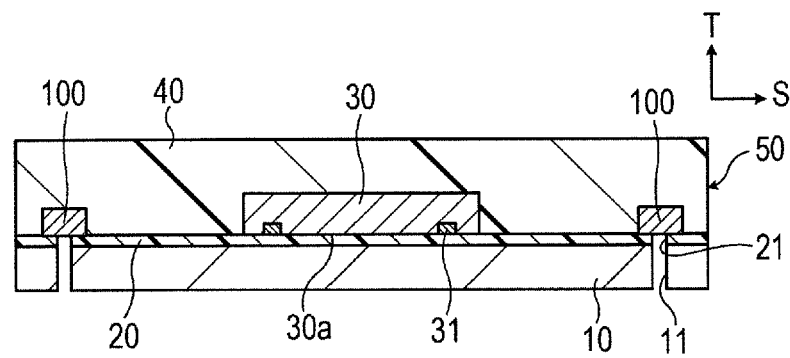
Figure 1D:
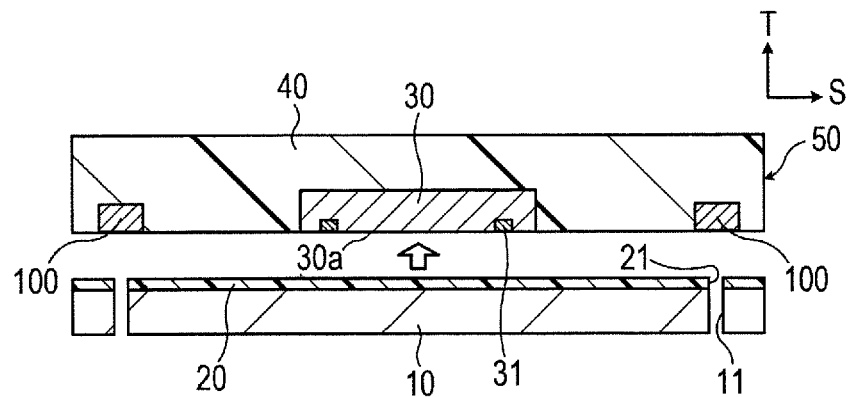

FIGS. 1A to 1D illustrate an example of a method of manufacturing semiconductor devices. Specifically, FIG. 1A schematically illustrates the cross section of the main elements in an example of an adhesive layer placement process, FIG. 1B schematically illustrates the cross section of the main elements in an example of a semiconductor element and part placement process, FIG. 1C schematically illustrates the cross section of the main elements in an example of a resin layer placement (pseudo wafer forming) process, and FIG. 1D schematically illustrates the cross section of the main elements in an example of a pseudo wafer detaching process. FIG. 2 illustrates a semiconductor device manufacturing process. Specifically, FIG. 2 is a perspective view schematically illustrating an example of the pseudo wafer detaching process.

In the manufacturing of a semiconductor device, an adhesive layer 20 is first formed on a support body 10, as shown in FIG. 1A. As an example, FIG. 1A illustrates a case in which the adhesive layer 20, having through-holes 21, is formed on the support body 10 having through-holes 11, the through-holes 21 and through-holes 11 communicating with each other. The through-holes 11 and through-holes 21, which communicate with each other, are provided so that when a pseudo wafer 50 described later is to be detached from the adhesive layer 20, an external force is applied to the pseudo wafer 50 through the through-holes 11 and through-holes 21.

After the adhesive layer 20 has been formed on the support body 10, a semiconductor element 30 having electrodes 31 is placed as an electronic part on the adhesive layer 20 formed on the support body 10 so that an electrode surface 30a, on which the electrodes 31 are placed, faces the adhesive layer 20, as illustrated in FIG. 1B. Although only one semiconductor element 30 is illustrated in FIG. 1B, the number of semiconductor elements 30 placed on the adhesive layer 20 is not limited to one. A plurality of semiconductor elements 30 may be placed in prescribed portions on the adhesive layer 20 so that their electrode surfaces 30a face the adhesive layer 20 as in FIG. 1B.

Parts 100 are further placed in areas on the adhesive layer 20 formed on the support body 10, each area including a portion corresponding to a combination of the mutually communicating through-hole 11 and through-hole 21, as illustrated in FIG. 1B. As the part 100, a dummy part or a dummy piece may be used, for example; the dummy part or dummy piece does not function as part of circuits of a semiconductor device (semiconductor package) to be manufactured. The part 100 is harder than, for example, a resin layer 40, which is cured on the adhesive layer 20 as described later. Each part 100 of this type is placed on the adhesive layer 20 so as to cover the mutually communicating through-hole 11 and through-hole 21.

After the semiconductor element 30 and parts 100 have been placed on the adhesive layer 20, the resin layer 40 is formed on the adhesive layer 20 as illustrated in FIG. 1C. The resin layer 40 is formed by, for example, mold forming and is disposed on the adhesive layer 20. Alternatively, the resin layer 40 may be formed on the adhesive layer 20 by pouring a resin in a frame formed so as to enclose the semiconductor element 30 and parts 100 on the adhesive layer 20. The resin layer 40 formed on the adhesive layer 20 is cured by, for example, being heated or irradiated with ultraviolet rays. Thus, the resin layer 40 is formed on the adhesive layer 20, forming a pseudo wafer (substrate) 50, on the adhesive layer 20, which has the semiconductor element 30 and parts 100 sealed with the resin layer 40.

The resin layer 40 may not be completely cured at this stage. It suffices to cure the resin layer 40 to an extent in which after being detached from the adhesive layer 20 as described later, the pseudo wafer 50 can be handled with its state maintained.

At this stage, conditions (temperature, irradiation with ultraviolet rays, and the like) under which the resin layer 40 is cured are set according to the materials of the resin layer 40 and adhesive layer 20 so that the adhesive force of the adhesive layer 20 is maintained. Alternatively, the material of the adhesive layer 20 is set according to the material of the resin layer 40 and the curing conditions.

Next, the pseudo wafer 50 formed on the adhesive layer 20 is detached from the adhesive layer 20 to separate the pseudo wafer 50 from the adhesive layer 20 and support body 10 as illustrated in FIG. 1D and FIG. 2. In this example, to detach the pseudo wafer 50 from the adhesive layer 20, an external force (indicated by the thin arrows in FIG. 2) is applied to the pseudo wafer 50 through the through-holes 11 formed in the support body 10 and the through-holes 21 formed in the adhesive layer 20 so as to communicate with the through-holes 11. For example, members such as pins are inserted into the through-holes 11 and through-holes 21 toward the pseudo wafer 50 and the pseudo wafer 50 is pressed by the members (the pseudo wafer 50 is pushed upward), detaching the pseudo wafer 50 from the adhesive layer 20. The electrode surface 30a of the semiconductor element 30 is exposed on the surface, of the pseudo wafer 50, that has been detached from the adhesive layer 20.

In the process to detach the pseudo wafer 50 from the adhesive layer 20 as described above, the parts 100, which are relatively hard (harder than the resin layer 40 cured on the adhesive layer 20, for example), have been placed on the pseudo wafer 50 on the adhesive layer 20 so as to cover the mutually communicating through-holes 11 and through-holes 21. When an external force is applied to the parts 100 through the mutually communicating through-holes 11 and through-holes 21, the pseudo wafer 50 is detached from the adhesive layer 20.

After the pseudo wafer 50 has been detached from the adhesive layer 20, the resin layer 40 may be further cured by, for example, heating or irradiation with ultraviolet rays.

A wiring layer (rewiring layer) including conductive parts (such as vias and wires), which are electrically connected to the electrodes 31 on the semiconductor element 30, is formed on the surface, of the pseudo wafer 50 formed as described above, that has been detached from the adhesive layer 20, that is, the surface on which the electrode surface 30a of the semiconductor element 30 is exposed. After the wiring layer has been formed, the resin layer 40 and wiring layer are cut around the semiconductor element 30 so that the pseudo wafer 50 is individualized into semiconductor devices (semiconductor packages) that each include the semiconductor element 30.

For comparison purposes, a method of manufacturing semiconductor devices, in another embodiment, that does not use the part 100 described above will be described.

Figure 3A:
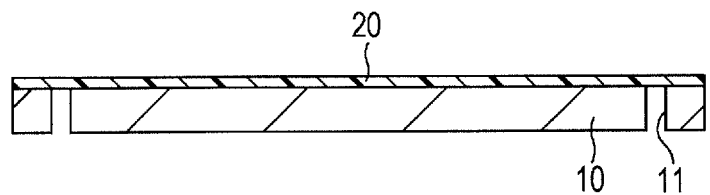
FIGS. 3A to 3D illustrate an example of a method of manufacturing semiconductor devices in another embodiment.
Figure 3B:
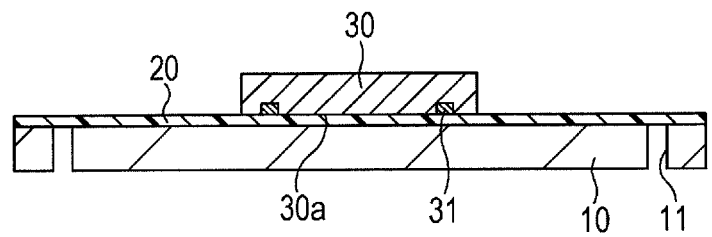
Figure 3C:
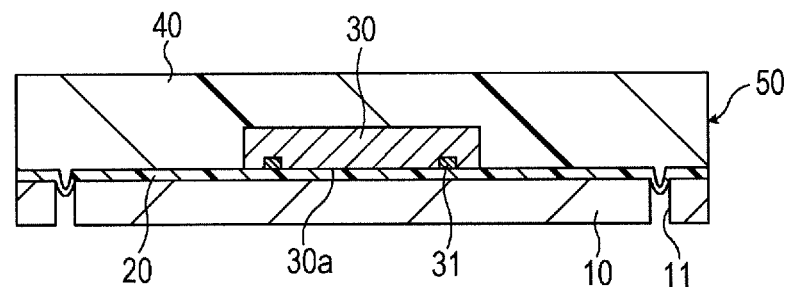
Figure 3D:
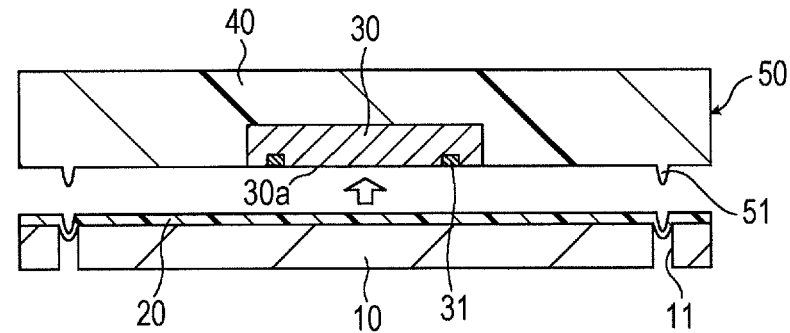

FIGS. 3A to 3D illustrate an example of a method of manufacturing semiconductor devices in another embodiment. Specifically, FIG. 3A schematically illustrates the cross section of the main elements in an example of an adhesive layer placement process, FIG. 3B schematically illustrates the cross section of the main elements in an example of a semiconductor element placement process, FIG. 3C schematically illustrates the cross section of the main elements in an example of a resin layer placement (pseudo wafer forming) process, and FIG. 3D schematically illustrates the cross section of the main elements in an example of a pseudo wafer detaching process.

The adhesive layer 20 is first placed on the support body 10, as shown in FIG. 3A. The support body 10 has a plurality of through-holes 11 at prescribed positions as in the example described above. In this example, however, the adhesive layer 20 has no through-holes 21 described above. The semiconductor element 30 is placed on the adhesive layer 20 of this type so that the electrode surface 30a of the semiconductor element 30 faces the adhesive layer 20 as illustrated in FIG. 3B. The resin layer 40 is formed on the adhesive layer 20, on which the semiconductor element 30 has been placed as described above, by, for example, mold forming as illustrated in FIG. 3C. When the resin layer 40 is cured, the pseudo wafer 50 is formed on the adhesive layer 20. After that, to detach the pseudo wafer 50 from the adhesive layer 20, an external force is applied to the pseudo wafer 50 by inserting members such as pins into the through-holes 11 formed in the support body 10 (in this example, the pseudo wafer 50 is pressed through the adhesive layer 20), as illustrated in FIG. 3D. After the pseudo wafer 50 has been detached from the adhesive layer 20, a wiring layer is formed on the surface, of the pseudo wafer 50, that has been detached from the adhesive layer 20, after which the pseudo wafer 50 is individualized into semiconductor devices (semiconductor packages).

If the method illustrated in FIGS. 3A to 3D is used, when an external force is applied to the pseudo wafer 50 by inserting members such as pins through the through-holes 11 in the process illustrated in FIG. 3D, the external force is locally exerted in portions corresponding to the through-holes 11 and the front surface of the pseudo wafer 50 may be thereby damaged. A wiring layer may not be precisely formed on the damaged surface of the pseudo wafer 50.

In a method that enables the pseudo wafer 50 to be easily detached from the adhesive layer 20 with damage to the pseudo wafer 50 suppressed, irradiation with ultraviolet rays, treatment with a chemical solution, or heating is performed to reduce the adhesive force of the adhesive layer 20 before the pseudo wafer 50 is detached. Once the adhesive force of the adhesive layer 20 has been lowered by irradiation with ultraviolet rays, treatment with a chemical solution, or heating in this way, however, it is difficult to reuse the adhesive layer 20 in a subsequent process. In this method, therefore, the used adhesive layer 20, the adhesive force of which has been lowered, is discarded and the adhesive layer 20 is replaced with a new one each time a pseudo wafer 50 is formed. When processing to lower the adhesive force of the adhesive layer 20 is performed as described above and the adhesive layer 20 becomes thereby unable to be repeatedly used, this leads to a cause in an increase in the number of person-hours taken in the manufacturing of the pseudo wafer 50, an increase in the cost of the pseudo wafer 50, and an increase in the cost of a semiconductor package formed from the pseudo wafer 50.

When the resin layer 40 is formed by, for example, mold forming, fixed pressure is applied to the resin layer 40 to form it in the process illustrated in FIG. 3C. In this case, resin in the resin layer 40 may press the adhesive layer 20 and may enter the through-holes 11 in the support body 10. When the resin of the resin layer 40 enters the through-holes 11, protrusions 51 are formed, on the surface, of the pseudo wafer 50, which is to be detached from the adhesive layer 20. When the pseudo wafer 50 has the protrusions 51, formed with resin of the resin layer 40, on the surface that has been detached from the adhesive layer 20 in the process illustrated in FIG. 3D, the flatness of the surface is lost. Accordingly, a wiring layer may not be precisely formed on the surface. When the through-hole 21 communicating with the through-hole 11 in the support body 10 is formed in the adhesive layer 20, this protrusion 51 is more easily formed.

By contrast, in the method illustrated in FIGS. 1A to 1D in which the parts 100 are used, the part 100, which is relatively hard and is placed so as to cover the mutually communicating through-hole 11 and through-hole 21, is pressed during the detachment of the pseudo wafer 50 from the adhesive layer 20. This suppresses the front surface of the pseudo wafer 50 from being damaged even if an external force is applied to detach the pseudo wafer 50 from the adhesive layer 20. Since the pseudo wafer 50 can be detached from the adhesive layer 20 by pressing the parts 100, damage to the surface of the pseudo wafer 50 can be suppressed even if a relative large external force is applied.

Furthermore, since the part 100 is pressed to detach the pseudo wafer 50 from the adhesive layer 20, the pseudo wafer 50 can be detached from the adhesive layer 20 without irradiation with ultraviolet rays, treatment with a chemical solution, heating, or other processing that is performed to lower the adhesive force of the adhesive layer 20. Accordingly, the reuse of the adhesive layer 20 becomes possible. Specifically, as illustrated in FIGS. 1A to 1D, the semiconductor element 30 and parts 100 are first placed on the adhesive layer 20 on the support body 10 and the resin layer 40 is formed thereon, forming a first pseudo wafer 50. The pseudo wafer 50 is then detached from the adhesive layer 20. Another semiconductor element 30 and other parts 100 are placed on the adhesive layer 20 from which the first pseudo wafer 50 has been detached and another resin layer 40 is placed thereon, forming a second pseudo wafer 50. The adhesive layer 20 from which the second pseudo wafer 50 has been detached may be used similarly to form a third pseudo wafer 50.

Since execution of processing to lower the adhesive force of the adhesive layer 20 can be suppressed and the adhesive layer 20 can be reused, it becomes possible to reduce the number of person-hours taken to replace the adhesive layer 20 formed on the support body 10 each time a pseudo wafer 50 is formed and to reduce costs. As a result, the costs of the pseudo wafer 50 and semiconductor package can be reduced.

Since the part 100 is placed so as to cover the mutually communicating through-hole 11 and through-hole 21, it becomes possible to suppress the resin used to form the resin layer 40 from entering the through-hole 11 and through-hole 21 (and thereby suppress the protrusion 51 described above from being formed) during the formation of the pseudo wafer 50 (resin layer 40). Thus, it becomes possible to obtain the pseudo wafer 50 having a superiorly flat surface that has been detached from the adhesive layer 20 and to precisely form a wiring layer on the surface.

Next, the method of manufacturing a semiconductor device in which the parts 100 described above are used will be described in more detail.

The support body 10 and adhesive layer 20 will be described first.

A substrate made of a semiconductor material such as silicon, a metal, a glass, a printed circuit board, a ceramic, or the like can be used as the support body 10. The through-hole 11 can be formed in the support body 10 by, for example, etching, punching, or drilling. A method of forming the through-hole 11 can be selected according to the material of the support body 10.

As the material of the adhesive layer 20, an epoxy resin, an acrylic resin, a polyimide resin, a silicone resin, or a urethane resin can be used or a material including at least one of these resins can be used. The adhesive layer 20 can be formed on the support body 10 by attaching an adhesive film formed by using one of the above materials onto the support body 10. The adhesive layer 20 can also be formed on the support body 10 by spin-coating, spray-coating, or printing one of the above materials onto the support body 10.

The adhesive layer 20 can be hollowed out in portions corresponding to the through-holes 11 in the support body 10 to form the through-holes 21, after which the adhesive layer 20 can be attached to the support body 10 by matching the position of each through-hole 21 and the position of its corresponding through-hole 11. Alternatively, the adhesive layer 20 having no through-holes 21 may be formed on the support body 10 having no through-holes 11, after which the mutually communicating through-holes 11 and through-holes 21 may be formed together by, for example, punching or drilling the support body 10 and adhesive layer 20.

As described above, the through-hole 11 and through-hole 21 are formed to apply an external force to the pseudo wafer 50 (to press the pseudo wafer 50 with members such as pins) during the detachment of the pseudo wafer 50 formed on the adhesive layer 20 on the support body 10. The diameters of the through-hole 11 and through-hole 21 are large enough to insert the members used to apply the external force.

Each combination of the mutually communicating through-hole 11 and through-hole 21 are formed in an area, on the support body 10 and adhesive layer 20, that corresponds to an area in which the pseudo wafer 50 is formed. The mutually communicating through-holes 11 and through-holes 21 are preferably formed at least at a circumferential end in the area corresponding to the pseudo wafer 50. If the mutually communicating through-holes 11 and through-holes 21 are formed at least at a circumferential end in the area corresponding to the pseudo wafer 50 in this way, when an external force is applied through the through-holes 11 and through-holes 21, the pseudo wafer 50 starts to be detached from the circumferential end. Accordingly, the pseudo wafer 50 can be easily detached when compared with, for example, a case in which the through-holes 11 and through-holes 21 are formed only in the central portion of the area corresponding to the pseudo wafer 50.

There is no limitation to the number of through-holes 11 and through-holes 21. In this example, a case in which a plurality of through-holes 11 are formed in the support body 10 and a plurality of through-holes 21 are formed in the adhesive layer 20 has been described as an example. Instead, only one through-hole 11 may be formed in the support body 10 and only one through-hole 21 may be formed in the adhesive layer 20 so as to mutually communicate, and the one through-hole 11 and the one through-hole 21 may be used to detach the pseudo wafer 50 from the adhesive layer 20. If the through-hole 11 and through-hole 21 are formed only in one portion so as to mutually communicate in this way, the through-hole 11 and through-hole 21 are preferably formed at a circumferential end in the area corresponding to the pseudo wafer 50 as described above.

Next, the semiconductor element 30 and part 100 placed on the adhesive layer 20 will be described.

As the semiconductor element 30, a bare chip such as a large-scale integration (LSI) chip can be used. The semiconductor element 30 is 0.1 mm to 0.5 mm thick, for example.

The part 100 is harder than, for example, the resin layer 40, which is cured on the adhesive layer 20. As the material of the part 100, a semiconductor material such as silicon, a glass, a metal, or a resin can be used, or a material including at least one of these materials can be used. The part 100 is placed in contact with the adhesive layer 20 so as to cover the through-hole 11 formed in the support body 10 and the through-hole 21 formed in the adhesive layer 20, the through-hole 11 and through-hole 21 being formed so as to mutually communicate. The size of the part 100 is such that an area in contact with the adhesive layer 20 is enough to cover the mutually communicating through-hole 11 and through-hole 21.

The part 100 can be provided in each portion at which the mutually communicating through-hole 11 and through-hole 21 are formed. The part 100 can also be provided so as to cover mutually communicating through-holes 11 and through-holes 21 in different portions.

On the surface in contact with the adhesive layer 20, the part 100 may have a structure that increases the strength of bonding to the adhesive layer 20.

Figure 4A:
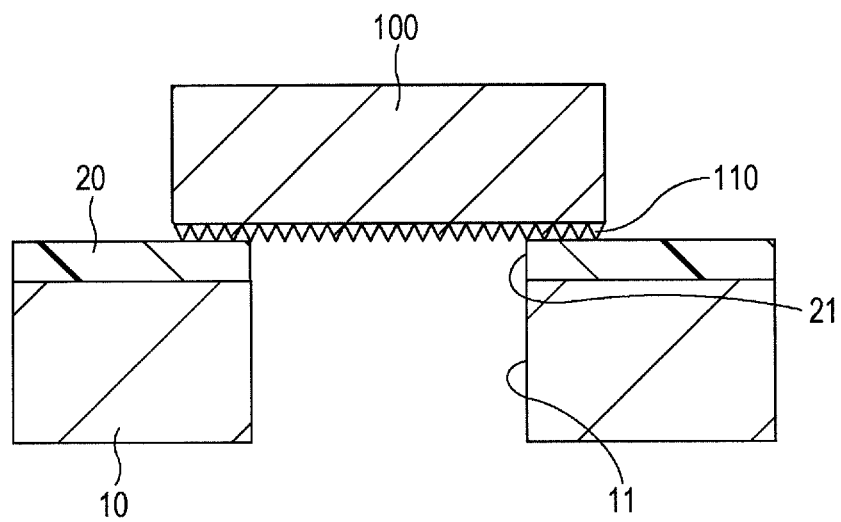
FIGS. 4A and 4B illustrate an example of the structure of a part.
Figure 4B:
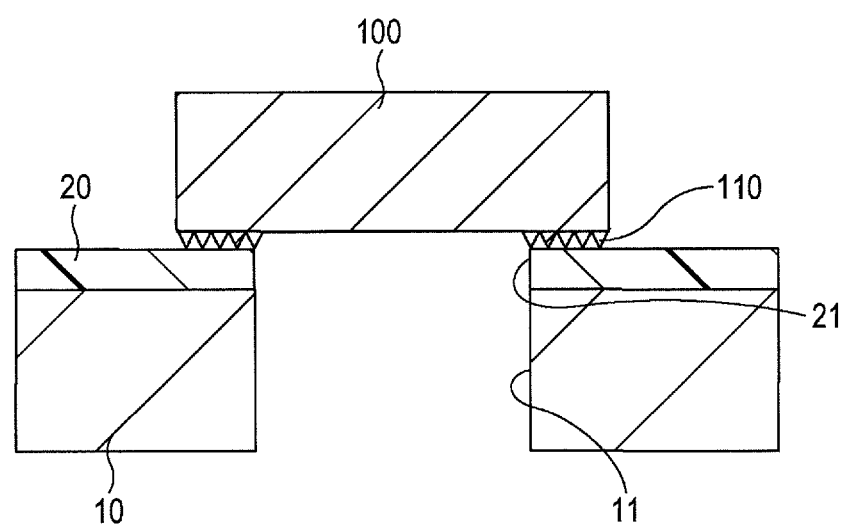

FIGS. 4A and 4B illustrate an example of the structure of the part 100. Specifically, FIGS. 4A and 4B schematically illustrate the cross section of the main elements in an example of the part 100 placed on the adhesive layer 20 on the support body 10.

The part 100 can have uneven spots 110 on the surface facing the adhesive layer 20 as illustrated in, for example FIG. 4A. When the part 100 having the uneven spots 110 is placed on the adhesive layer 20, a contact area between the part 100 and the adhesive layer 20 is increased due to the uneven spots 110, so the strength of bonding between the part 100 and the adhesive layer 20 can be increased. The part 100 can also selectively have uneven spots 110 in portions in contact with the adhesive layer 20, as illustrated in FIG. 4B. The part 100 having these uneven spots 110 can also increase the strength of bonding to the adhesive layer 20.

When the strength of bonding between the part 100 and the adhesive layer 20 is increased, a merit described below is obtained. That is, when the pseudo wafer 50 is formed on the adhesive layer 20 as illustrated in FIG. 1C, if the resin layer 40 placed so as to seal the semiconductor element 30 and parts 100 is cured, the resin layer 40 may contract. If the part 100 is displaced as the result of the contraction of the resin layer 40 due to curing, the opening of the mutually communicating through-hole 11 and through-hole 21 may not be partially or completely covered. In this case, the resin of the resin layer 40 enters the mutually communicating through-hole 11 and through-hole 21 and a protrusion made of the resin of the resin layer 40 is formed on the pseudo wafer 50. Since the flatness of the pseudo wafer 50 is thereby lost, a wiring layer may not be precisely formed in a subsequent process. If the portion of the part 100 that is brought into contact with the adhesive layer 20 has a small area, the part 100 is easily displaced.

If the part 100 has the uneven spots 110, however, the contact area between the part 100 and the adhesive layer 20 is increased and the strength of bonding therebetween is increased, making it possible to suppress the part 100 from being displaced on the adhesive layer 20. Then, it becomes possible to suppress the protrusion made of the resin of the resin layer 40 from being formed on the pseudo wafer 50 and to precisely form a wiring layer on the surface, of the pseudo wafer 50, that has been detached from the adhesive layer 20.

Next, the resin layer 40 will be described.

The resin layer 40 can be made of any one of various non-conductive sealing resin materials that can seal the semiconductor element 30. The resin layer 40 may include a non-conductive filler. The resin layer 40 to be formed on the adhesive layer 20 is, for example, at least 0.1 mm thicker than the semiconductor element 30 placed on the adhesive layer 20.

The thickness of the resin layer 40 in the pseudo wafer 50 may be the same as or much the same as the thickness of the semiconductor element 30; for example, the thickness of the resin layer 40 may be such that the surface (rear surface) opposite to the electrode surface 30a of the semiconductor element 30 is exposed on the resin layer 40. In this case, to form the pseudo wafer 50, the resin layer 40 is formed on the adhesive layer 20 on the support body 10 so as to cover the semiconductor element 30, after which the resin layer 40 on the rear surface of the semiconductor element 30 may be thinned by polishing or grinding the resin layer 40.

Next, the formation of the wiring layer and individualization will be described.

After the pseudo wafer 50 has been detached from the adhesive layer 20, a wiring layer is formed on the surface, of the pseudo wafer 50, that has been detached from the adhesive layer 20 (the electrode surface 30a of the semiconductor element 30 is exposed on the surface). The wiring layer can be formed by any one of the methods described below.

A photosensitive resin such as, for example, photosensitive epoxy, photosensitive polybenzoxazole, or photosensitive polyimide is first applied to the surface, of the pseudo wafer 50, that has been detached from the adhesive layer 20, after which exposure to light, development, and curing are carried out to form openings, each of which extends to the electrode 31 on the electrode surface 30a of the semiconductor element 30. After curing, plasma processing may be carried out. Then, a copper layer and a metal contact layer including titanium, chromium, and the like are formed by sputtering to form a seed layer. A photoresist is then formed that is patterned so as to have openings corresponding to portions where vias and wires will be formed, and is copper-electroplated by using the already formed seed layer. The photoresist is then removed and the seed layer remaining in the area where the photoresist had been formed. To remove the seed layer, wet etching may be carried out or drying etching may be carried out. After the removal of the seed layer, wires may undergo surface treatment to, for example, improve adhesion. After the completion of the processes described above, a wiring layer is formed.

Multi-layer wires, in which the wiring layer is used as a first layer, may be formed by similarly repeating the process to apply a photosensitive resin and later processes as described above to form a second layer and later.

A protective film such as a solder resist is formed on the wiring layer, which is the uppermost front surface, so as to expose part of the wires. A routing area exposed on the protective film is used as an externally connected terminal. Surface treatment may be carried out for the routing area exposed on the protective film to form a nickel-film and also form a gold-film thereon. A bump such as a solder ball may also be mounted in the routing area exposed on the protective film or in the routing area for which the surface treatment has been carried out to form a nickel-film and a gold-film.

After the wiring layer has been formed as described above, a semiconductor device (semiconductor package) including the semiconductor element 30 is obtained by cutting the resin layer 40 and wiring layer around the semiconductor element 30 for individualization.

Figure 5A:
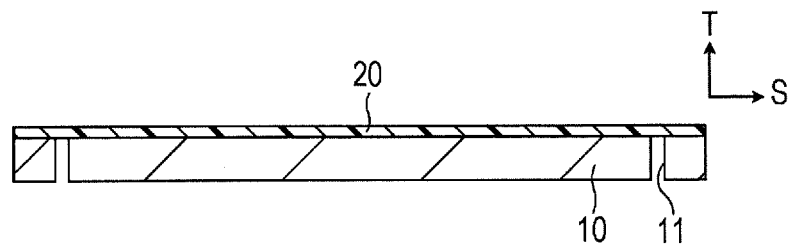
FIGS. 5A to 5D illustrate another example of a method of manufacturing semiconductor devices.
Figure 5B:
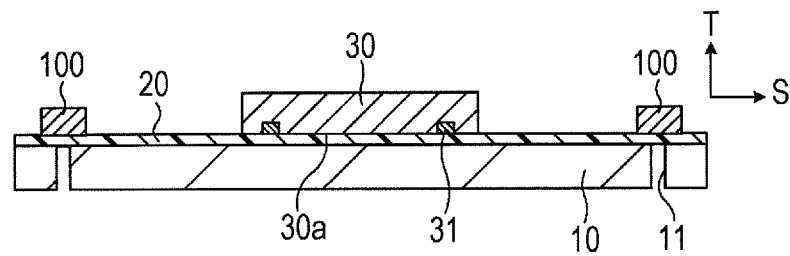
Figure 5C:
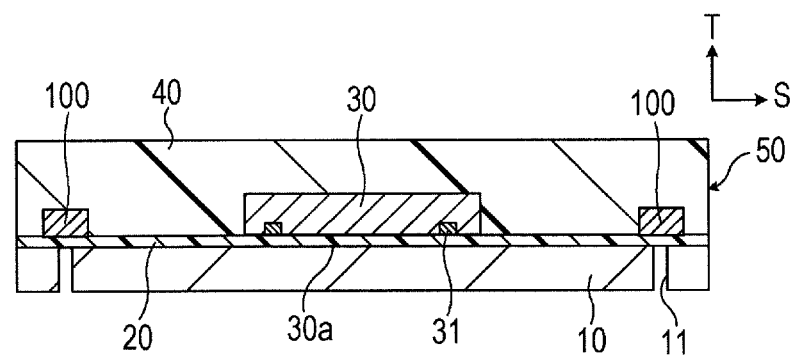
Figure 5D:
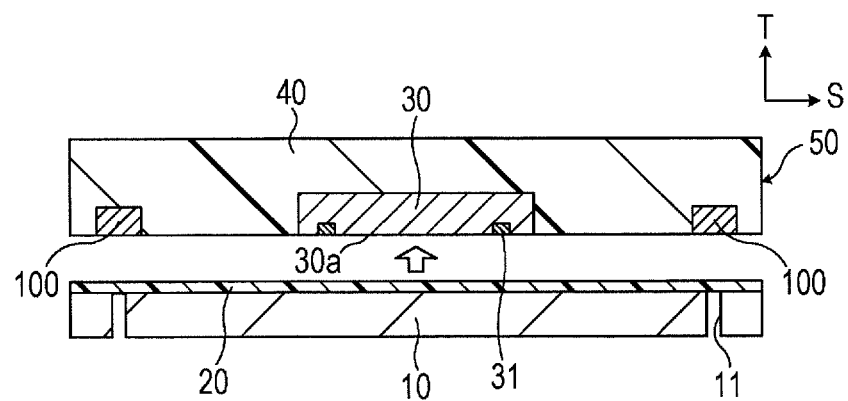

The part 100 described above can be used in a case as well in which the adhesive layer 20 having no through-holes 21 is formed on the support body 10 having the through-holes 11. FIGS. 5A to 5D illustrate another example of a method of manufacturing semiconductor devices. Specifically, FIG. 5A schematically illustrates the cross section of the main elements in an example of an adhesive layer placement process, FIG. 5B schematically illustrates the cross section of the main elements in an example of a semiconductor element and part placement process, FIG. 5C schematically illustrates the cross section of the main elements in an example of a resin layer placement (pseudo wafer forming) process, and FIG. 5D schematically illustrates the cross section of the main elements in an example of a pseudo wafer detaching process.

In the method illustrated in FIGS. 5A to 5D, the adhesive layer 20 having no through-holes 21 is formed on the support body 10 having the through-holes 11 as illustrated in FIG. 5A. The semiconductor element 30 is placed on the adhesive layer 20 so that the electrode surface 30a faces the adhesive layer 20 and the parts 100 are placed in areas each of which includes a portion corresponding to through-hole 11 in the support body 10, as illustrated in FIG. 5B. Then, the resin layer 40 is formed and is cured to form the pseudo wafer 50, as illustrated in FIG. 5C. The pseudo wafer 50 is detached from the adhesive layer 20 as illustrated in FIG. 5D. The resin layer 40 may be further cured in some cases.

In a case as well in which the method illustrated in FIGS. 5A to 5D is used, when the parts 100 are placed, the pseudo wafer 50 can be detached from the adhesive layer 20 with damage to the front surface of the pseudo wafer 50 suppressed.

In addition, the pseudo wafer 50 can be detached from the adhesive layer 20 by pressing the parts 100 on the pseudo wafer 50 without lowering the adhesive force of the adhesive layer 20 by, for example, irradiation with ultraviolet rays, treatment with a chemical solution, or heating. Accordingly, the number of person-hours and costs can be reduced. Since execution of processing to lower the adhesion force of the adhesive layer 20 can be suppressed, the adhesive layer 20 can be reused. Specifically, after the pseudo wafer 50 has been formed as illustrated in FIGS. 5A to 5C and has been removed from the adhesive layer 20 as illustrated in FIG. 5D, another pseudo wafer 50 can also be newly formed on that adhesive layer 20 as illustrated in FIGS. 5B and 5C.

Since the parts 100 are placed, it becomes possible to suppress the resin of the resin layer 40 from pressing the adhesive layer 20 and entering the through-holes 11, suppressing protrusions made of the resin of the resin layer 40 from being formed on the pseudo wafer 50. Thus, it becomes possible to precisely form a wiring layer on the pseudo wafer 50.

The adhesive force of the adhesive layer 20, illustrated in FIGS. 1A to 1D and FIGS. 5A to 5D, formed on the support body 10 may be such that the pseudo wafer 50 can be detached without performing processing to lower the adhesive force in advance. For example, the adhesive force of the adhesive layer 20 in the surface direction (indicated by S in FIGS. 1A to 1D and FIGS. 5A to 5D), in which the pseudo wafer 50 is formed, is such that the semiconductor element 30 and parts 100 placed on the adhesive layer 20 can be left attached without being displaced until the pseudo wafer 50 is detached. The adhesive force of the adhesive layer 20 in the direction in which the pseudo wafer 50 is detached, indicated by T in FIGS. 1A to 1D and FIGS. 5A to 5D, is such that the pseudo wafer 50 can be easily detached. In an example of the adhesive layer 20 of this type, the adhesive force in the direction T, in which the pseudo wafer 50 is detached, is weaker than the adhesive force in the surface direction S, in which the pseudo wafer 50 is formed.

When the adhesive layer 20 as described above is used, the displacement of the semiconductor element 30 and parts 100 in the surface direction S is suppressed from when the pseudo wafer 50 is formed on the adhesive layer 20 until the pseudo wafer 50 is detached from the adhesive layer 20 (from the state in FIG. 1B to the state in FIG. 1D and from the state in FIG. 5B to the state in FIG. 5D).

If, for example, the resin layer 40 placed so as to seal the semiconductor element 30 and parts 100 contracts due to curing during the formation of the pseudo wafer 50 on the adhesive layer 20, the semiconductor element 30 and parts 100 may be displaced in the direction S. If the semiconductor element 30 is displaced in the direction S, when a wiring layer is formed on the pseudo wafer 50 in a later process, an electric connection failure may be caused between the semiconductor element 30 and a wire on or a via in the wiring layer. If the part 100 is displaced in the direction S, the resin of the resin layer 40 may enter the through-hole 11 and through-hole 21 as described above and protrusions made of the resin of the resin layer 40 may be formed on the pseudo wafer 50.

When the adhesive layer 20 as described above is used, however, even if the resin layer 40 contracts due to curing, it is possible to effectively suppress the semiconductor element 30 and parts 100 from being displaced on the adhesive layer 20 in the direction S and to precisely form a wiring layer under a fixed condition in a later process.

When the adhesive layer 20 is characterized in that the adhesive force in the direction T, in which the pseudo wafer 50 is detached, is weaker than the adhesive force in the surface direction S, a clearance can be formed between the pseudo wafer 50 and the adhesive layer 20 and the pseudo wafer 50 can be easily detached from the adhesive layer 20, starting from the clearance; to detach the pseudo wafer 50, processing to lower the adhesive force of the adhesive layer 20 is not carried out or a large force is not applied.

Figure 6A:
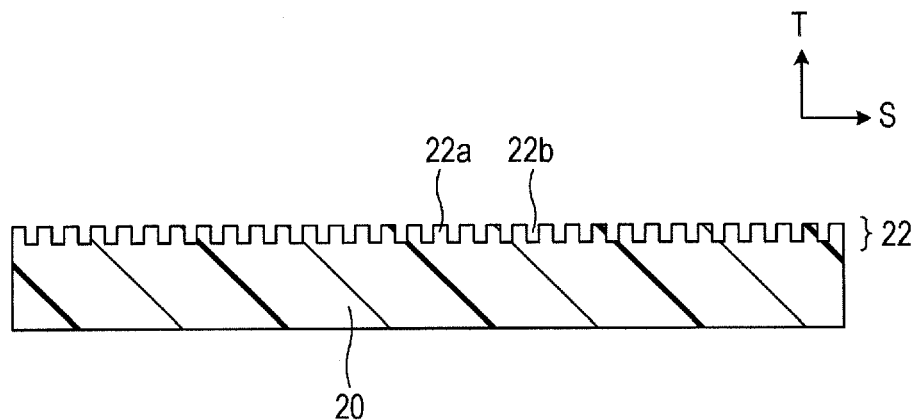
FIGS. 6A and 6B illustrate an example of the structure of an adhesive layer.
Figure 6B:
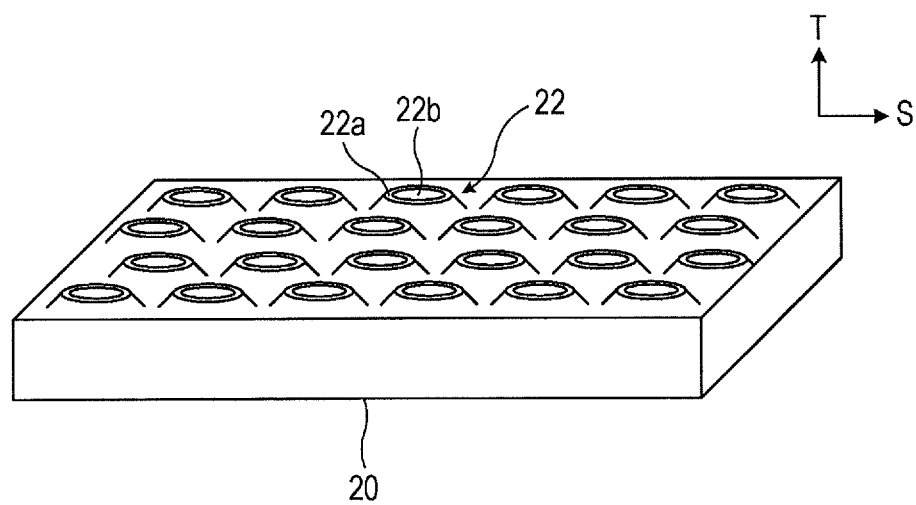

An example of the adhesive layer 20 characterized in that the adhesive force in the direction T, in which the pseudo wafer 50 is detached, is weaker than the adhesive force in the surface direction S, in which the pseudo wafer 50 is formed, is illustrated in FIGS. 6A and 6B.

FIGS. 6A and 6B illustrate an example of the structure of the adhesive layer 20. Specifically, FIG. 6A schematically illustrates the cross section of the main elements in an example of the adhesive layer 20, and FIG. 6B is a perspective view of the main elements in the example of the adhesive layer 20.

The adhesive layer 20 has uneven spots 22 on a surface, as illustrated in FIG. 6A, which is, in this example, the surface on which to place the semiconductor element 30 and resin layer 40 to form the pseudo wafer 50. The uneven spots 22 can be placed so that their convex parts 22a are placed like dots or parallel lines. Alternatively, parallel lines of convex parts 22a can be placed horizontally and vertically like a grid. The uneven spot 22 can also be formed in a crater shape in which a convex part 22a is formed like a ring that encloses a concave part 22b as illustrated in FIG. 6B.

To form the uneven spot 22, an imprint method, plasma processing, dry etching, wet etching, or the like can be used.

When the uneven spot 22 is formed by, for example, an imprint method, a mold is prepared in which one concave part is formed in correspondence to one convex part 22a of the uneven spot 22 and one convex part is formed in correspondence of one concave part 22b and the mold is pressed against a layer that is formed on the support body 10, on which the adhesive layer 20 is formed. Thus, the adhesive layer 20 on which uneven spots 22 are formed in correspondence to the mold is obtained.

As for the uneven spot 22 in a crater shape, a layer in which an acrylic resin filler is mixed in a matrix material including an epoxy resin or polyimide resin is formed on the support body 10, after which the front surface of the layer undergoes oxygen plasma processing or the like. In the oxygen plasma processing, since the etching rate of the acrylic resin filler is higher than the etching rate of the matrix material including an epoxy resin or polyimide resin, the acrylic resin filler in the front surface of the layer is selectively removed. Concave parts 22b are formed in portions from which the acrylic resin filler has been selectively removed and thereby the adhesive layer 20 in which the uneven spots 22 in a crater shape are formed is obtained.

When the adhesive layer 20 having the uneven spots 22 as described above is used, it becomes possible to suppress the semiconductor element 30 and parts 100 placed on the adhesive layer 20 from being displaced in the direction S and to easily detach the pseudo wafer 50 formed on the adhesive layer 20.

When the adhesive layer 20 formed so that the adhesive force in the direction T, in which the pseudo wafer 50 is detached, is weaker than the adhesive force in the surface direction S, in which the pseudo wafer 50 is formed, is used together with the parts 100, it becomes possible to easily detach, from the adhesive layer 20, the pseudo wafer 50 on which a wiring layer can be precisely formed.

A method of manufacturing semiconductor devices will be described in more detail by using specific examples.

A first embodiment will be described first with reference to FIGS. 7A and 7B to FIG. 12.

Figure 7A:
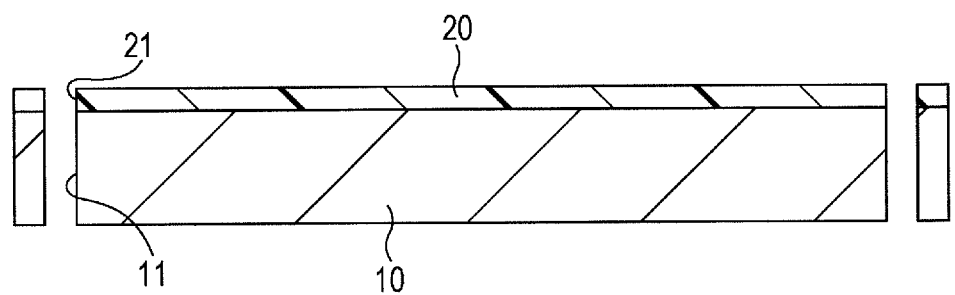
FIGS. 7A and 7B illustrate a support body and adhesive layer preparation process in a first embodiment.
Figure 7B:
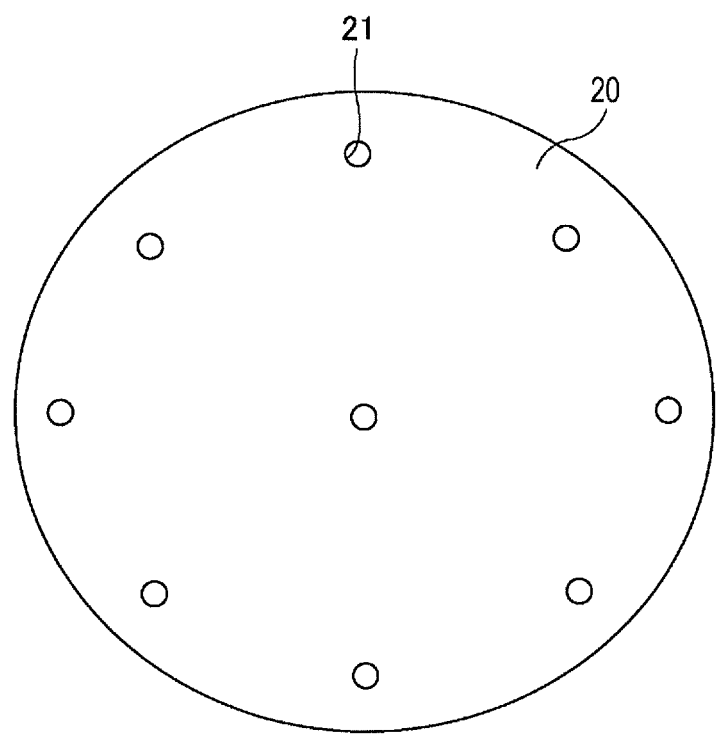

FIGS. 7A and 7B illustrate a support body and adhesive layer preparation process in the first embodiment. Specifically, FIG. 7A schematically illustrates the cross section of the main elements of the support body and the adhesive layer preparation process in the first embodiment, and FIG. 7B is a schematic plan view of the support body and adhesive layer preparation process in the first embodiment.

The adhesive layer 20 is first formed on the support body 10, after which the through-holes 11 are formed in the support body 10 and the through-holes 21 are formed in the adhesive layer 20.

The support body 10 is formed with, for example, a stainless steel (SUS) substrate that is 156 mm in diameter and 1.0 mm thick. The adhesive layer 20 is uniformly formed on the support body 10, after which the mutually communicating through-hole 11 and through-hole 21 are formed together by, for example, drilling. These mutually communicating through-hole 11 and through-hole 21 are formed so as to have a diameter of 2 mm in a total of nine portions, eight portions at circumferential ends of the support body 10 and adhesive layer 20 and one portion at their centers, for example.

Figure 8A:
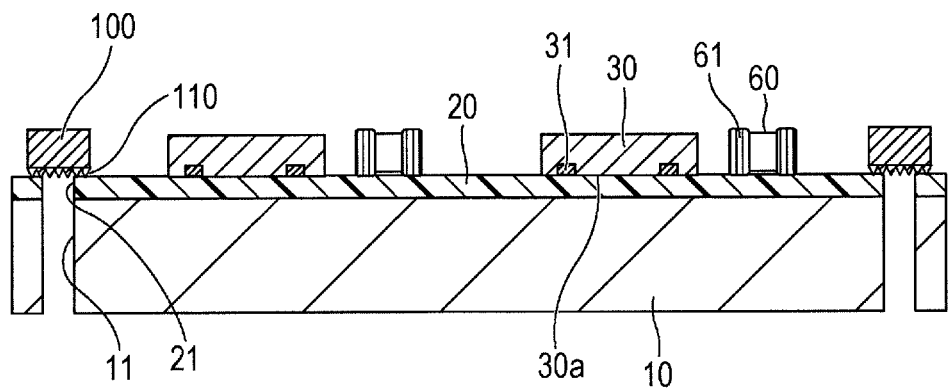
FIGS. 8A and 8B illustrate a part placement process in the first embodiment.
Figure 8B:
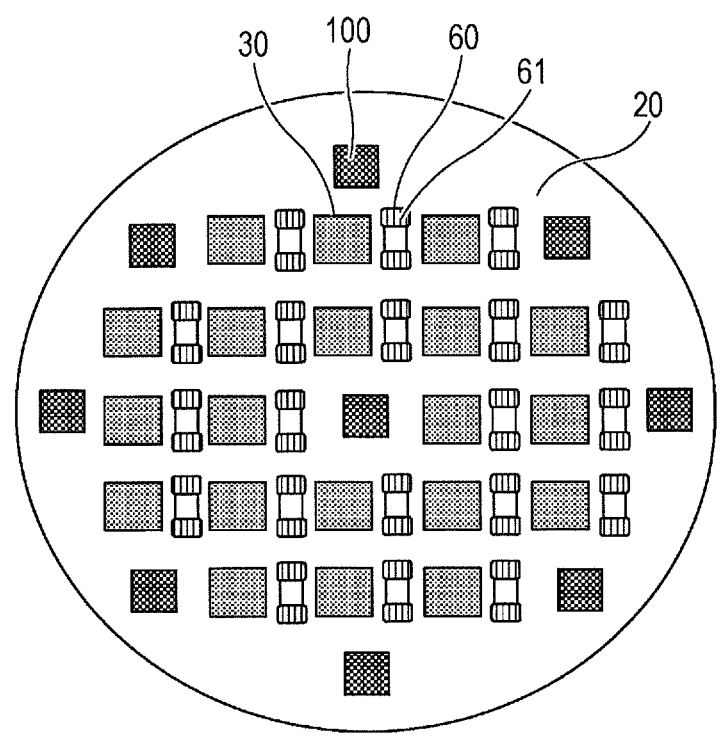

FIGS. 8A and 8B illustrate a part placement process in the first embodiment. Specifically, FIG. 8A illustrates the cross section of the main elements in the part placement process in the first embodiment, and FIG. 8B is a schematic plan view in the part placement process in the first embodiment.

After the through-holes 11 and through-holes 21 have been respectively formed in the support body 10 and adhesive layer 20, semiconductor elements 30 and chip parts 60 such as capacitors are placed in prescribed areas on the adhesive layer 20. The parts 100 such as dummy pieces are placed in areas, on the adhesive layer 20, each of which includes a portion corresponding to a combination of the mutually communicating through-hole 11 and through-hole 21.

For example, semiconductor elements 30 with a thickness of 0.4 mm are placed on the adhesive layer 20 by using a flip chip bonder, and chip parts 60 with a thickness of 0.33 mm are placed on the adhesive layer 20 by using a mounter. The semiconductor elements 30 and chip parts 60 are placed (equally spaced, for example) so that the electrodes 31 and electrodes 61 come into contact with the front surface of the adhesive layer 20.

The part 100 is, for example, a copper dummy piece that has uneven spots 110 on at least one surface. The uneven spot 110 is formed by, for example, sulfuric-acid-based etching. The part 100 of this type is placed in each area that includes a portion corresponding to a combination of the mutually communicating through-hole 11 and through-hole 21 so that its surface having the uneven spots 110 comes into contact with the front surface of the adhesive layer 20. The uneven spot 110 contributes to an increase in the size of an area in which the part 100 comes into contact with the adhesive layer 20 and thereby to an increase in bonding strength.

Figure 9A:
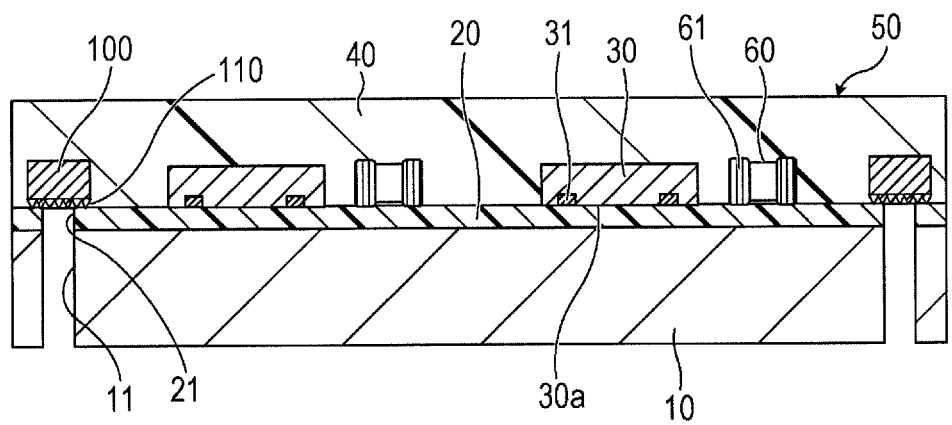
FIGS. 9A and 9B illustrate a resin layer forming process in the first embodiment.
Figure 9B:
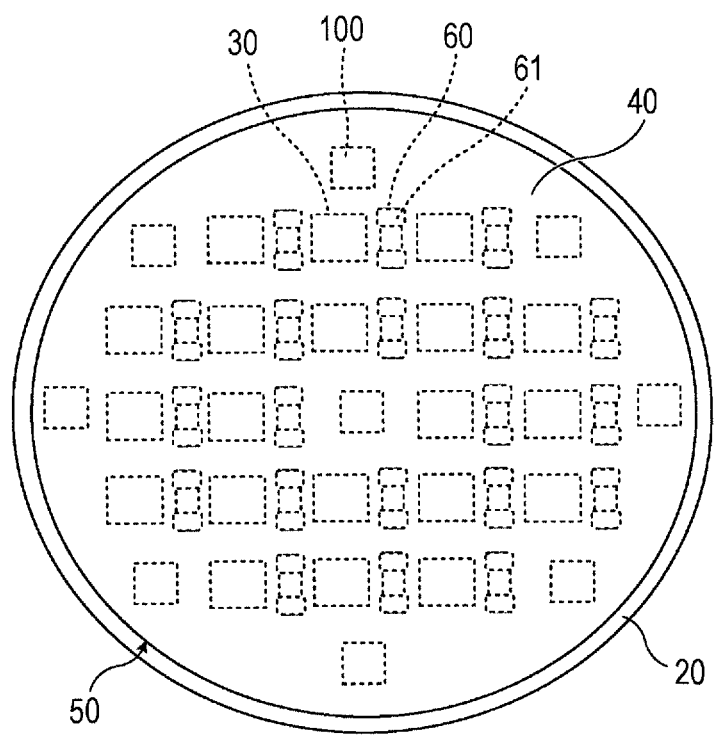

FIGS. 9A and 9B illustrate a resin layer placement (pseudo wafer formation) process in the first embodiment. Specifically, FIG. 9A schematically illustrates the cross section of the main elements in the resin layer forming process in the first embodiment, and FIG. 9B is a schematic plan view in the resin layer forming process in the first embodiment.

After the semiconductor elements 30, chip parts 60, and parts 100 have been placed in prescribed areas, the resin layer 40 is formed on the adhesive layer 20 so as to seal them and is then cured to form the pseudo wafer 50.

The resin layer 40, which seals the semiconductor elements 30, chip parts 60, and parts 100, is formed by, for example, mold forming in which a metal mold is used, and is then cured by heating or another method to form the pseudo wafer 50 with a diameter of 150 mm on the adhesive layer 20.

When the resin layer 40 is formed, the displacement of the semiconductor elements 30, chip parts 60, and parts 100 on the adhesive layer 20 is suppressed. The part 100, which covers the mutually communicating through-hole 11 and through-hole 21, suppresses the resin of the resin layer 40 from entering the mutually communicating through-hole 11 and through-hole 21.

Figure 10A:
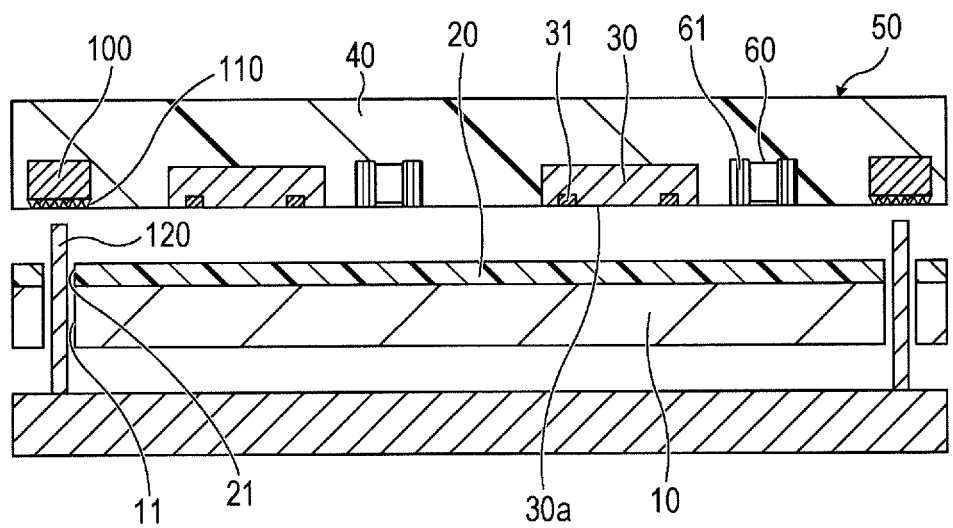
FIGS. 10A and 10B illustrate a pseudo wafer detaching process in the first embodiment.
Figure 10B:
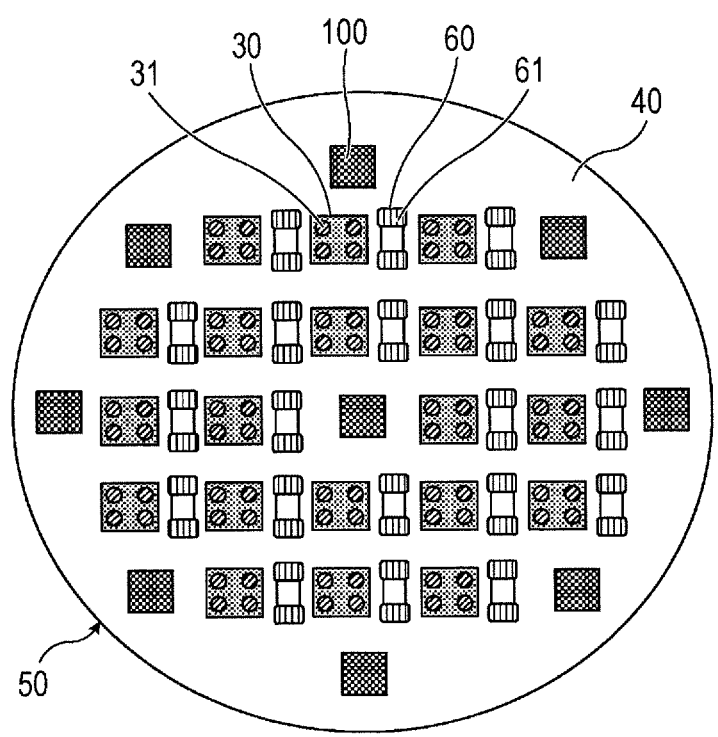

FIGS. 10A and 10B illustrate a pseudo wafer detaching process in the first embodiment. Specifically, FIG. 10A schematically illustrates the cross section of the main elements in the pseudo wafer detaching process in the first embodiment, and FIG. 10B is a schematic plan view of the pseudo wafer detaching process in the first embodiment, in which the surface, of the pseudo wafer 50, that has been detached from the adhesive layer 20 is schematically illustrated.

After the pseudo wafer 50 has been formed, the formed pseudo wafer 50 is detached from the adhesive layer 20 to separate the pseudo wafer 50 from the support body 10 and adhesive layer 20. To detach the pseudo wafer 50, pins 120 are inserted into the mutually communicating through-holes 11 and through-holes 21, which have been respectively formed in the support body 10 and adhesive layer 20 in nine portions in advance, and the pseudo wafer 50 is pressed by the inserted pins 120. The electrodes 31 on the semiconductor elements 30, the electrodes 61 on the chip parts 60, and parts 100 (specifically, uneven spots 110) are then exposed on the surface, of the pseudo wafer 50, that has been detached from the adhesive layer 20.

When the pseudo wafer 50 is detached, the part 100 on the pseudo wafer 50 is directly pressed by the pin 120, so damage to the front surface of the pseudo wafer 50 by the pin 120 is suppressed. During the detachment of the pseudo wafer 50, it is suppressed to perform irradiation with ultraviolet rays, treatment with a chemical solution, heating, or another process to lower the adhesion force of the adhesive layer 20.

When the pseudo wafer 50 was formed by performing the processes as illustrated in FIGS. 7A and 7B to FIGS. 10A and 10B, significant displacement of the semiconductor element 30, chip part 60, and part 100 was not observed on the surface that had been detached from the adhesive layer 20. Neither damage to the front surface of the pseudo wafer 50 nor formation of convex parts on the resin layer 40 was also observed.

Figure 11:
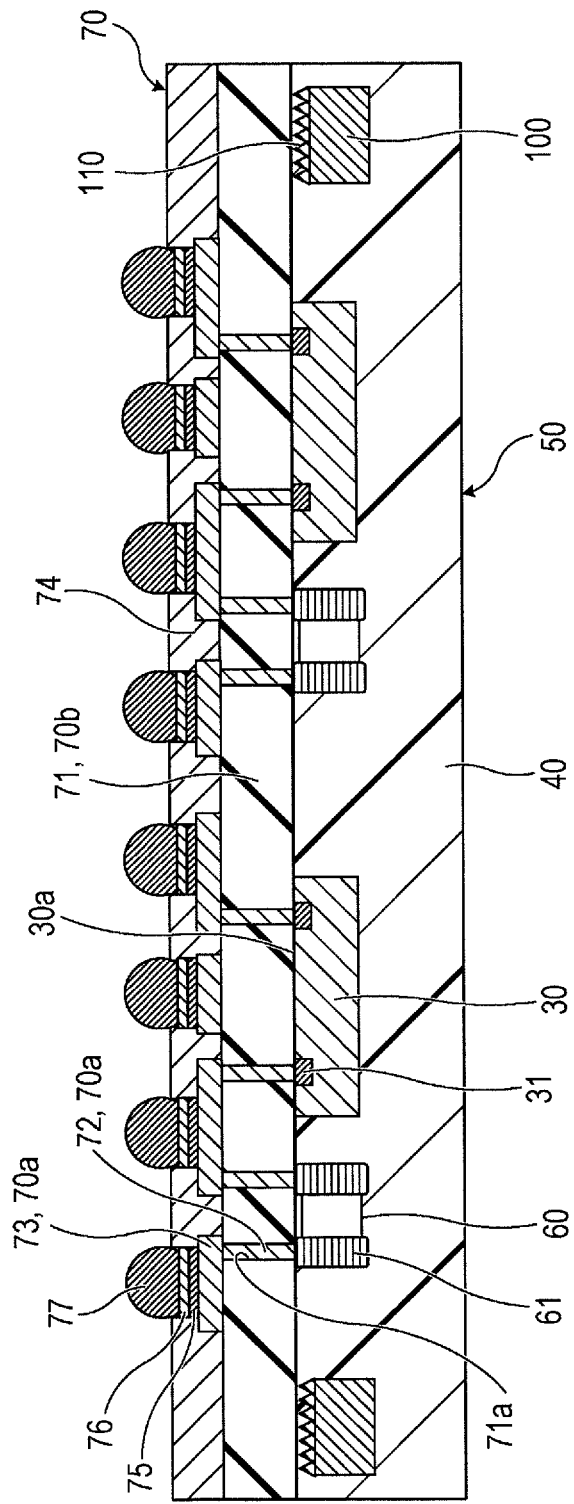
FIG. 11 illustrates a wiring layer forming process in the first embodiment.

FIG. 11 illustrates a wiring layer forming process in the first embodiment. Specifically, FIG. 11 schematically illustrates the cross section of the main elements in the wiring layer forming process in the first embodiment.

After the pseudo wafer 50 has been detached from the adhesive layer 20 as illustrated in FIGS. 10A and 10B, the pseudo wafer 50 is heated for one hour at 150° C. to completely cure the pseudo wafer 50 (including the resin layer 40). Then, a wiring layer 70 is formed on the surface, of the pseudo wafer 50, that has been detached from the adhesive layer 20. The wiring layer 70 includes conductive parts 70a (such as vias and wires), which are electrically connected to the electrodes 31 of the semiconductor elements 30 and the electrodes 61 of the chip parts 60 as well as insulating parts 70b formed around the conductive parts 70a.

To form the wiring layer 70, a photosensitive resin such as a photosensitive polyimide varnish is first applied to the surface, of the pseudo wafer 50, that has been detached from the adhesive layer 20 (surface on which the electrodes 31, electrodes 61, and parts 100 are exposed) by, for example, spin-coating. Pre-baking, exposure to light, development, curing, and oxygen plasma processing are performed for the photosensitive resin to form an insulating layer 71 (70b) that has openings 71a extending to the electrodes 31 of the semiconductor element 30 and to the electrodes 61 of the chip part 60. The insulating layer 71 is 5 μm thick, for example. The opening 71a is 30 μm in diameter, for example.

Next, a titanium layer and a copper layer are formed by sputtering to form a seed layer (not illustrated). The titanium layer is 0.2 μm thick, for example. The copper layer is 0.5 μm thick, for example. After the seed layer has been formed, a photoresist is formed that is patterned so as to have openings corresponding to portions where vias and wires will be formed, and is then copper-electroplated by using the seed layer. Upon completion of the electroplating, the photoresist is removed and the portions, of the seed layer, that have been covered with the photoresist are removed by wet etching or drying etching. Thus, vias 72 and wires 73 (70a) are formed, which extend to the electrodes 31 of the semiconductor elements 30 and to the electrodes 61 of the chip parts 60. The wire 73 may undergo surface treatment to, for example, improve adhesiveness.

As described above, the wiring layer 70, in which the vias 72 and wires 73 are formed in the insulating layer 71, is formed. Multi-layer wires may be formed on the pseudo wafer 50 by repeating a process similar to the process to form the wiring layer 70 as described above.

A protective layer 74 such as a solder resist is formed on the wiring layer 70, which is the uppermost layer, so as to expose part (external connection terminals) of the wires 73 (external connection terminals). Surface treatment, such as surface treatment to form a nickel layer 75 and a gold layer 76, is performed for an area, of each wire 73, that is exposed on the protective layer 74. A bump 77 such as a solder ball is mounted on an area (surface for which surface treatment has been performed to form the nickel layer 75 and gold layer 76), of the wire 73, that functions as an external connection terminal.

Figure 12:
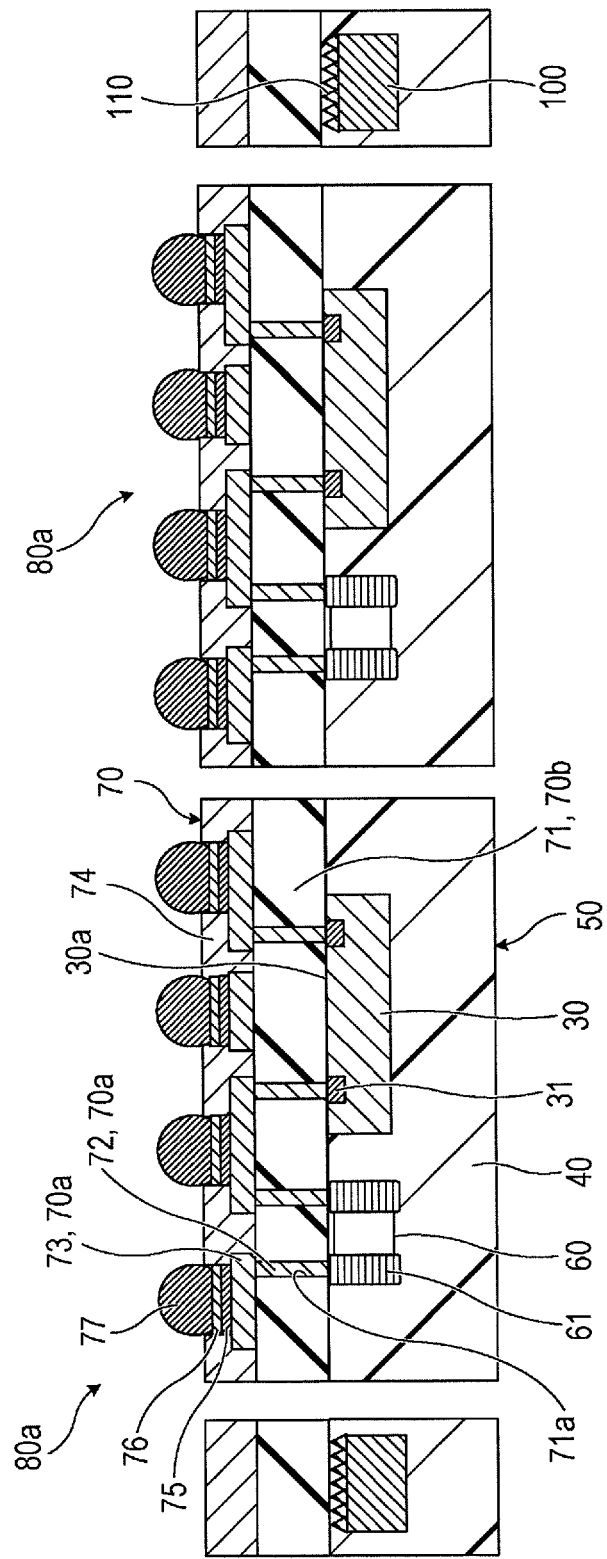
FIG. 12 illustrates an individualizing process in the first embodiment.

FIG. 12 illustrates an individualizing process in the first embodiment. Specifically, FIG. 12 schematically illustrates the cross section of the main elements in the individualizing process in the first embodiment.

After the wiring layer 70 has been formed and the bumps 77 have been mounted, the pseudo wafer 50 and wiring layer 70 are cut at prescribed positions by, for example, dicing. Thus, individualized semiconductor devices (semiconductor packages) 80a, each of which includes the semiconductor element 30 and chip part 60, are obtained.

When the pseudo wafer 50 and wiring layer 70 are individualized, they can be cut at such positions that the part 100 is not included in each individualized semiconductor device 80a.

The semiconductor device 80a can be manufactured through the processes illustrated in FIGS. 7A and 7B to FIG. 12. After the process to detach the pseudo wafer 50, illustrated in FIGS. 10A and 10B, has been executed, the support body 10 and adhesive layer 20, from which the pseudo wafer 50 has been detached, can be reused to form a next pseudo wafer 50. Specifically, after the pseudo wafer 50 has been detached from the support body 10 and adhesive layer 20, new semiconductor elements 30, chip parts 60, and parts 100 are placed on that adhesive layer 20 as illustrated in FIGS. 8A and 8B and a new resin layer 40 is formed as illustrated in FIGS. 9A and 9B to form a new pseudo wafer 50. Semiconductors 80a are formed similarly from the new pseudo wafer 50 as illustrated in FIGS. 10A and 10B to FIG. 12.

In the method of manufacturing the semiconductor device 80a in the first embodiment, the pseudo wafer 50 can be easily detached from the adhesive layer 20 by pressing the parts 100 placed on the pseudo wafer 50 through the mutually communicating through-holes 11 and through-holes 21, with damage to the front surface of the pseudo wafer 50 being suppressed. Since execution of processing to lower the adhesion force of the adhesive layer 20 can be suppressed during the detachment of the pseudo wafer 50 from the adhesive layer 20, the adhesive layer 20 can be reused. Therefore, the number of person-hours and costs involved in the manufacturing of the semiconductor devices 80a can be reduced.

Next, a second embodiment will be described with reference to FIG. 13 to FIG. 20.

In the second embodiment as well, the adhesive layer 20 is first formed on the support body 10, and the through-holes 11 and through-holes 21 are respectively formed in the support body 10 and adhesive layer 20, as described in the first embodiment with reference to FIGS. 7A and 7B. The support body 10 is formed with, for example, a stainless steel (SUS) substrate that is 156 mm in diameter and 1.0 mm thick. The adhesive layer 20 is then formed on the support body 10, after which the mutually communicating through-holes 11 and through-holes 21 are formed together by, for example, drilling. These mutually communicating through-hole 11 and through-hole 21 are formed so as to have a diameter of 2 mm in a total of nine portions, eight portions at circumferential ends of the support body 10 and adhesive layer 20 and one portion at their centers, for example.

In the second embodiment, after the support body 10 and 20 have been prepared, processes as illustrated in FIG. 13 to FIG. 19 are executed.

Figure 13:
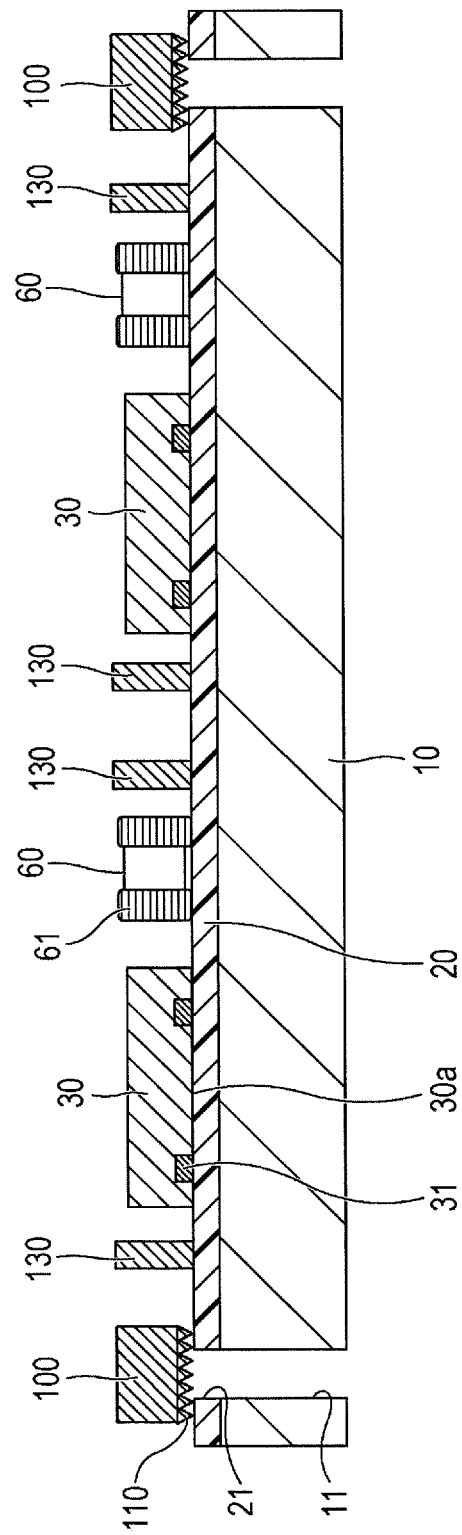
FIG. 13 illustrates a part placement process in a second embodiment.

FIG. 13 illustrates a part placement process in the second embodiment. Specifically, FIG. 13 schematically illustrates the cross section of the main elements in the part placement process in the second embodiment.

First, a copper foil is bonded onto the adhesive layer 20 and a dry film resist is further bonded onto the copper foil. The dry film is exposed to light and developed and the copper foil is dry-etched to form copper posts 130 in prescribed areas on the adhesive layer 20. The thickness of the copper foil bonded to the adhesive layer 20 (the height of the post 130) is 0.5 mm, for example.

After the posts 130 have been formed, the semiconductor elements 30 and chip parts 60 are placed in prescribed areas on the adhesive layer 20 and the parts 100 are also placed in areas each of which includes a portion corresponding to a combination of the mutually communicating through-hole 11 and through-hole 21.

For example, semiconductor elements 30 with a thickness of 0.4 mm are placed on the adhesive layer 20 by using a flip chip bonder, and chip parts 60 with a thickness of 0.33 mm are placed on the adhesive layer 20 by using a mounter. The semiconductor elements 30 and chip parts 60 are placed (equally spaced, for example) so that the electrodes 31 and electrodes 61 come into contact with the front surface of the adhesive layer 20.

The part 100 is, for example, a SUS304 dummy piece 0.5 mm thick that has uneven spots 110 on at least one surface. The part 100 of this type is placed in each area that includes a portion corresponding to a combination of the mutually communicating through-hole 11 and through-hole 21 so that its surface having the uneven spots 110 comes into contact with the front surface of the adhesive layer 20.

Figure 14:
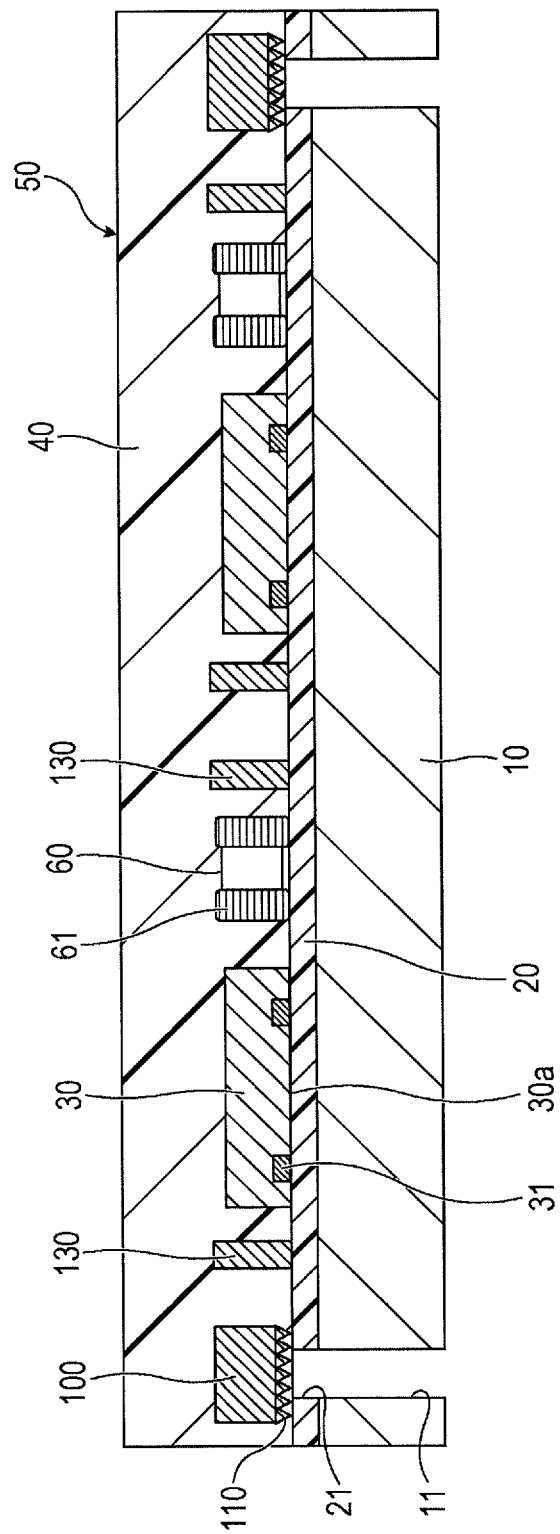
FIG. 14 illustrates a resin layer forming process in the second embodiment.

FIG. 14 illustrates a resin layer forming process in the second embodiment. Specifically, FIG. 14 schematically illustrates the cross section of the main elements in the resin layer forming process in the second embodiment.

After the semiconductor elements 30, chip parts 60, and parts 100 have been placed in prescribed areas, the resin layer 40 is formed on the adhesive layer 20 so as to seal them and is then cured to form the pseudo wafer 50. The resin layer 40, which seals the semiconductor elements 30, chip parts 60, and parts 100, is formed by, for example, mold forming in which a metal mold is used, and is then cured by heating or another method to form the pseudo wafer 50 with a diameter of 150 mm on the adhesive layer 20.

When the resin layer 40 is formed, the displacement of the semiconductor elements 30, chip parts 60, and parts 100 on the adhesive layer 20 is suppressed. The part 100 suppresses the resin of the resin layer 40 from entering the mutually communicating through-hole 11 and through-hole 21.

Figure 15:
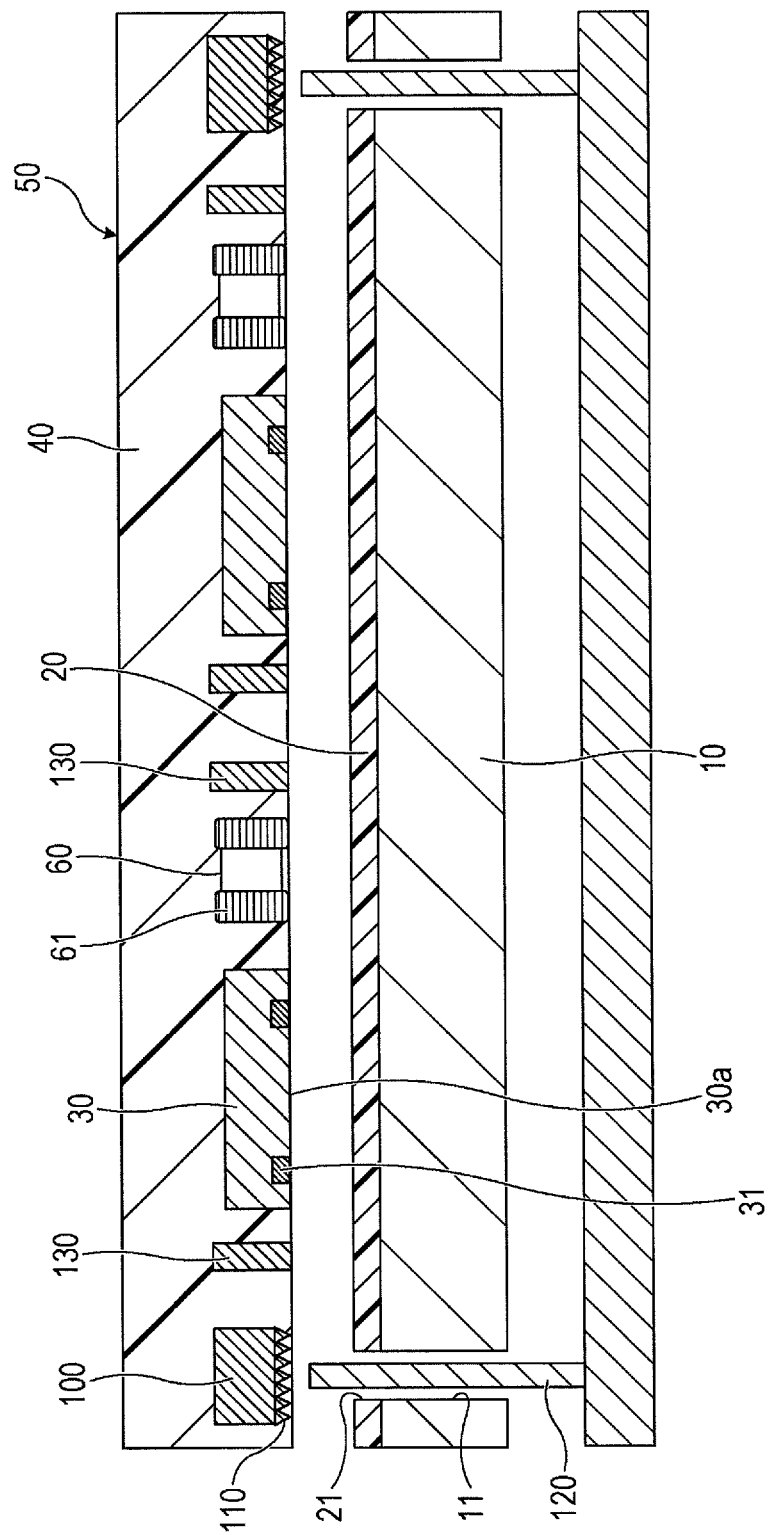
FIG. 15 illustrates a pseudo wafer detaching process in the second embodiment.

FIG. 15 illustrates a pseudo wafer detaching process in the second embodiment. Specifically, FIG. 15 schematically illustrates the cross section of the main elements in the pseudo wafer detaching process in the second embodiment.

After the pseudo wafer 50 has been formed, the pins 120 are inserted into the mutually communicating through-holes 11 and through-holes 21 and the parts 100 on the pseudo wafer 50 is pressed by the inserted pins 120 to detach the pseudo wafer 50 from the adhesive layer 20 and thereby to separate the pseudo wafer 50 from the support body 10 and adhesive layer 20. The posts 130, the electrodes 31 on the semiconductor elements 30, the electrodes 61 on the chip parts 60, and parts 100 (specifically, uneven spots 110) are exposed on the surface, of the pseudo wafer 50, that has been detached from the adhesive layer 20.

When the pseudo wafer 50 is detached, the part 100 is pressed by the pin 120, so damage to the front surface of the pseudo wafer 50 by the pin 120 is suppressed. It is suppressed to perform irradiation with ultraviolet rays, treatment with a chemical solution, heating, or other processing to lower the adhesion force of the adhesive layer 20 during the detachment of the pseudo wafer 50.

When the pseudo wafer 50 was formed by performing processes as illustrated in FIGS. 7A and 7B and FIG. 13 to FIG. 15, significant displacement of the post 130, semiconductor element 30, chip part 60, and part 100 was not observed on the surface that had been detached from the adhesive layer 20. Neither damage to the front surface of the pseudo wafer 50 nor formation of convex parts on the resin layer 40 was also observed.

Figure 16:
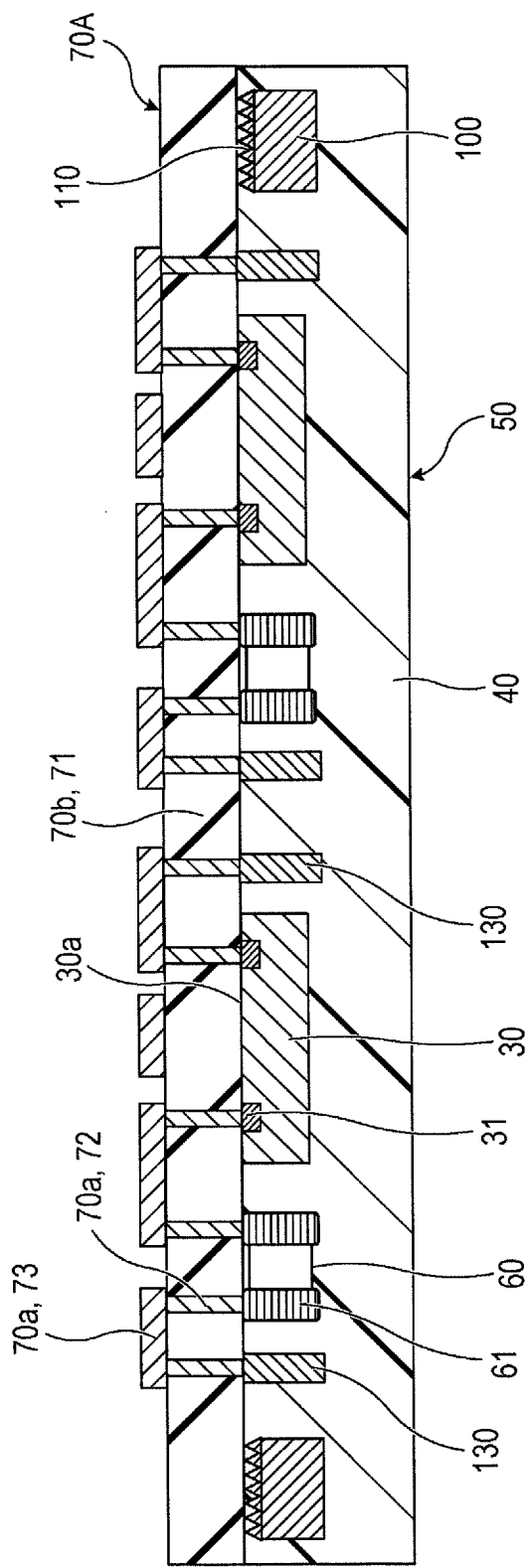
FIG. 16 illustrates a first wiring layer forming process in the second embodiment.

FIG. 16 illustrates a first wiring layer forming process in the second embodiment. Specifically, FIG. 16 schematically illustrates the cross section of the main elements in the first wiring layer forming process in the second embodiment.

After the pseudo wafer 50 has been detached from the adhesive layer 20 as illustrated in FIGS. 10A and 10B, the pseudo wafer 50 is heated for one hour at 250° C. to completely cure the pseudo wafer 50 (including the resin layer 40). Then, a first wiring layer 70A, which includes the conductive parts 70a and insulating parts 70b, is formed on the surface, of the pseudo wafer 50, that has been detached from the adhesive layer 20. The first wiring layer 70A is formed so as to include the conductive parts 70a, each of which is electrically connected to the electrode 31 of the semiconductor element 30, the electrode 61 of the chip part 60, and the post 130, which are all exposed after the pseudo wafer 50 has been detached from the adhesive layer 20. The first wiring layer 70A can be formed in a process similar to the process to form the wiring layer 70 described in the above first embodiment with reference to FIG. 11.

Multi-layer wires may be formed on the pseudo wafer 50 by repeating a process similar to the process to form the first wiring layer 70A.

Figure 17:
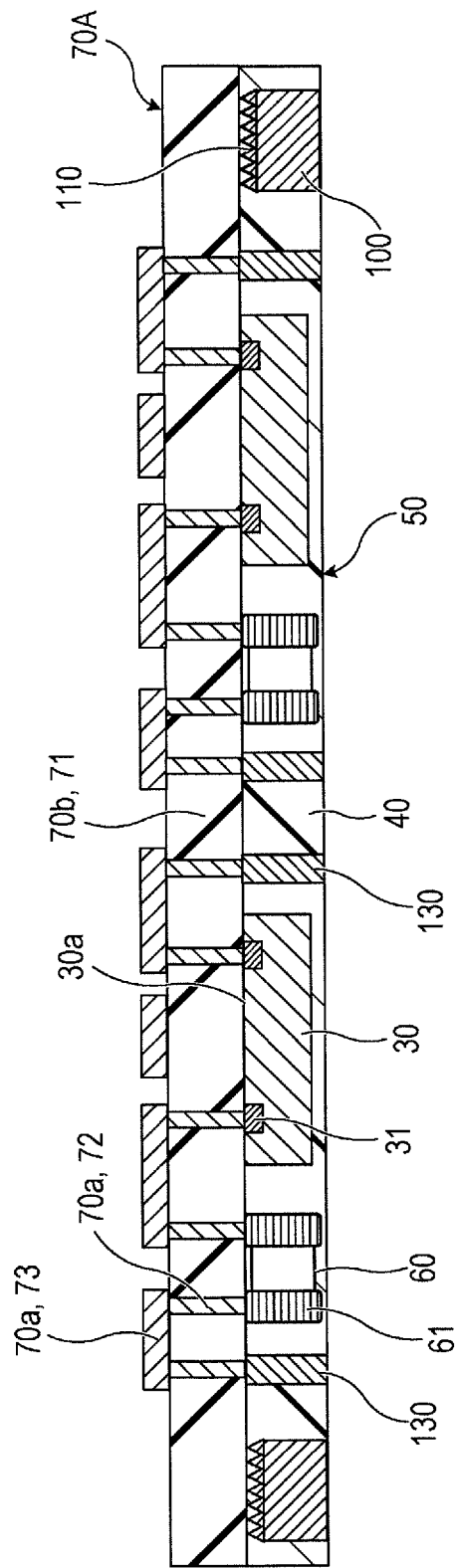
FIG. 17 illustrates a grinding process in the second embodiment.

FIG. 17 illustrates a grinding process in the second embodiment. Specifically, FIG. 17 schematically illustrates the cross section of the main elements in the grinding process in the second embodiment.

After the first wiring layer 70A has been formed on the pseudo wafer 50, the surface opposite to the surface on which the first wiring layer 70A has been formed, that is, the resin layer 40, undergoes backgrinding to thin the substrate on which the first wiring layer 70A has been formed on the pseudo wafer 50. In this process, the resin layer 40 is ground so that the posts 130 and parts 100 are exposed.

Figure 18:
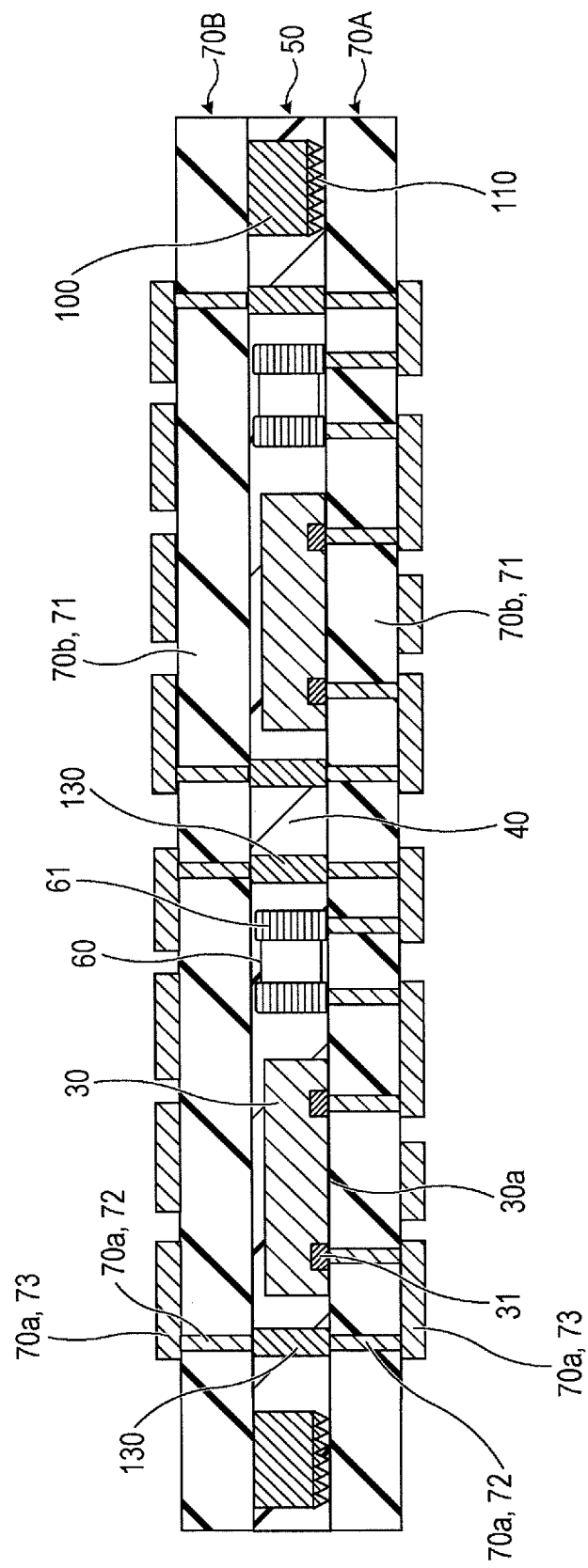
FIG. 18 illustrates a second wiring layer forming process in the second embodiment.

FIG. 18 illustrates a second wiring layer forming process in the second embodiment. Specifically, FIG. 18 schematically illustrates the cross section of the main elements in the second wiring layer forming process in the second embodiment.

After the resin layer 40 has been ground, a second wiring layer 70B, which includes the conductive parts 70a and insulating parts 70b, is formed on the surface that has been ground. The second wiring layer 70B is formed so that the conductive parts 70a, which are electrically connected to the posts 130 exposed as a result of exposure. The second wiring layer 70B is electrically connected to the first wiring layer 70A through the posts 130, which pass through the pseudo wafer 50. The second wiring layer 70B of this type can be formed in a process similar to the process to form the first wiring layer 70A described with reference to FIG. 16 (or wiring layer 70 described in the above first embodiment with reference to FIG. 11).

Multi-layer wires may be formed on the ground surface of the resin layer 40 on the pseudo wafer 50 by repeating a process similar to the process to form the second wiring layer 70B.

Figure 19:
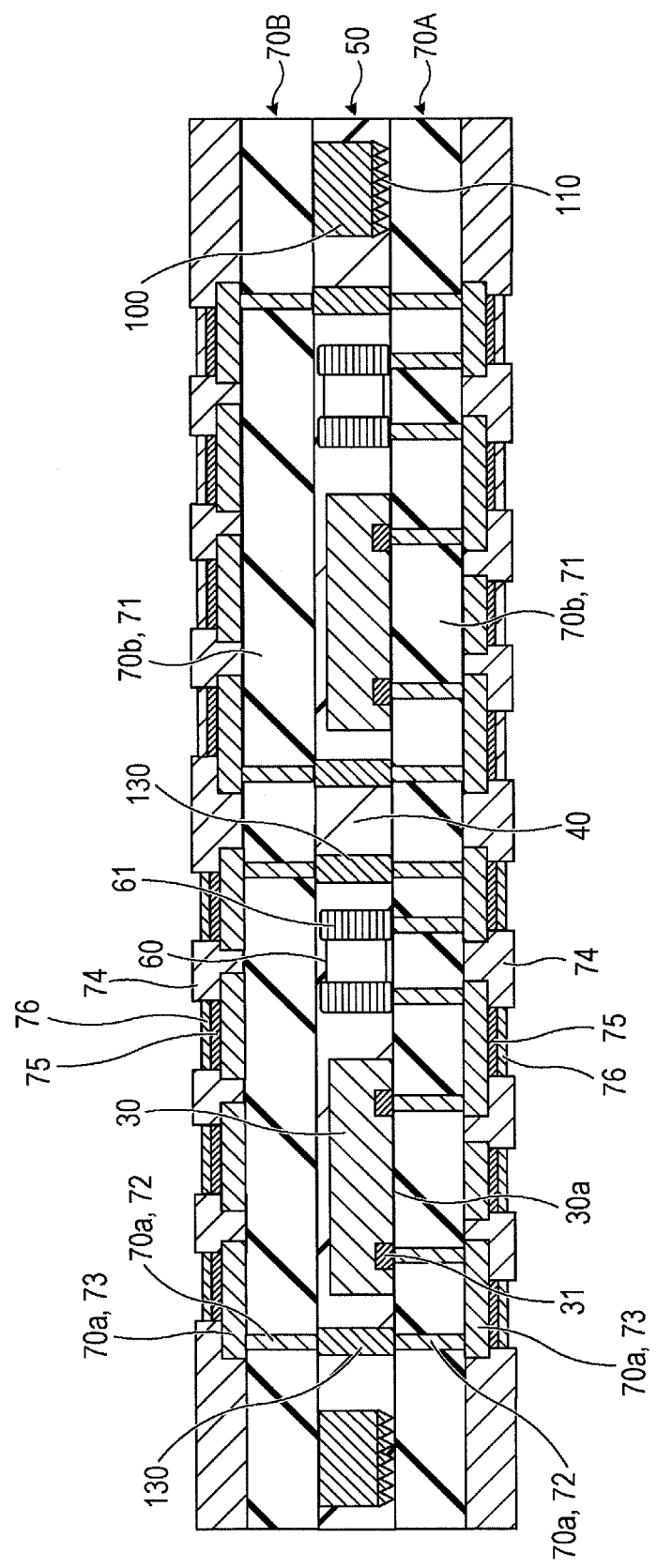
FIG. 19 illustrates a protective film forming and surface treatment process in the second embodiment.

FIG. 19 illustrates a protective film forming and surface treatment process in the second embodiment. Specifically, FIG. 19 schematically illustrates the cross section of the main elements in the protective film forming and surface treatment process in the second embodiment.

After the first wiring layer 70A with one layer or a plurality of layers and the second wiring layer 70B with one layer or a plurality of layers (in this example, the first wiring layer 70A and second wiring layer 70B each has one layer), a protective film 74 such as a solder resist is formed on the first wiring layer 70A and second wiring layer 70B, each of which is the outermost layer, so that part of the wires 73 on the first wiring layer 70A and second wiring layer 70B are exposed. Surface treatment, such as surface treatment to form a nickel layer 75 and a gold layer 76, is performed for an area, of each wire 73, that is exposed on the protective layer 74.

Figure 20:
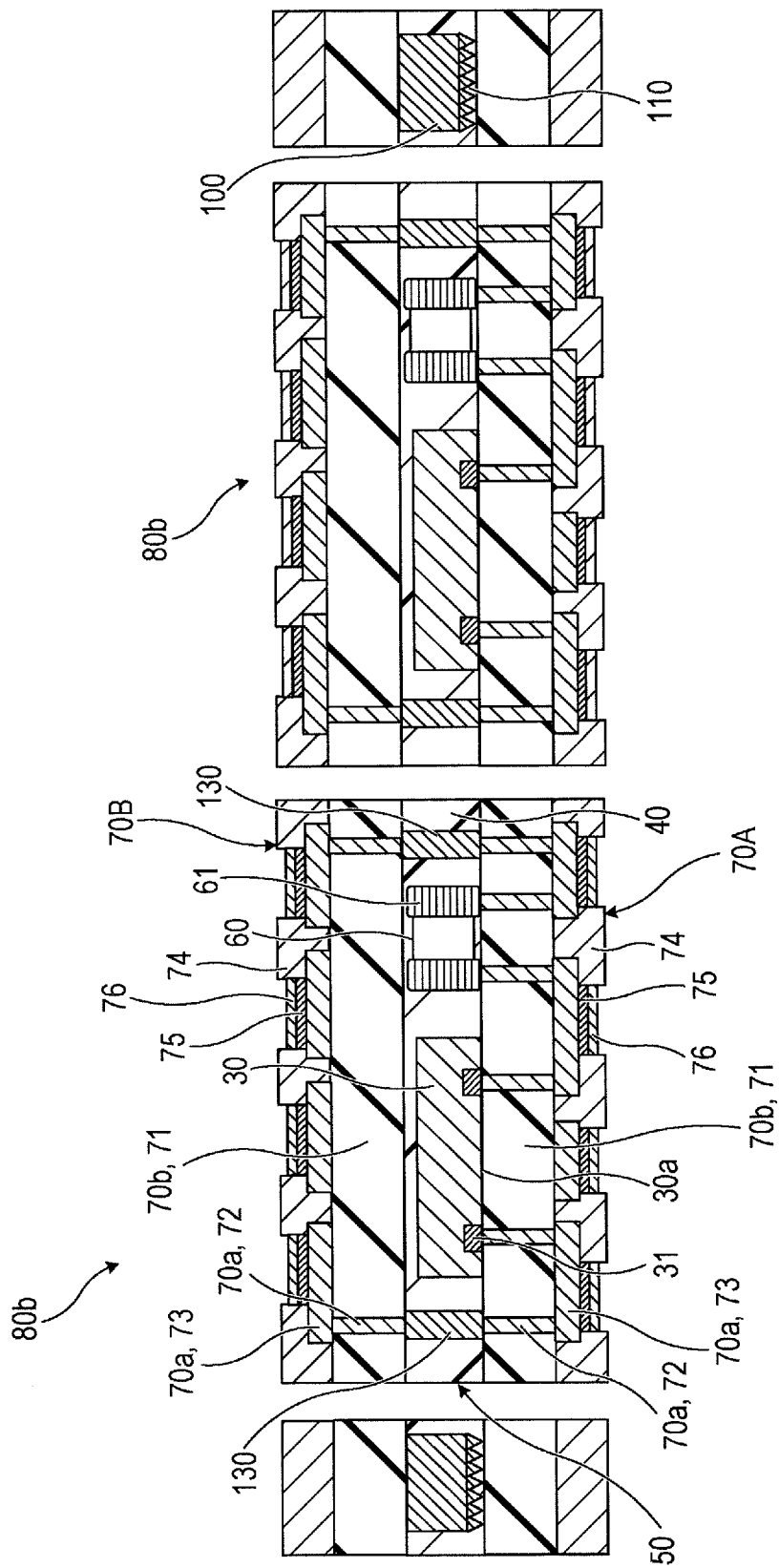
FIG. 20 illustrates an individualizing process in the second embodiment.

FIG. 20 illustrates an individualizing process in the second embodiment. Specifically, FIG. 20 schematically illustrates the cross section of the main elements in the individualizing process in the second embodiment.

After the first wiring layer 70A and second wiring layer 70B have been formed, the pseudo wafer 50, first wiring layer 70A, and second wiring layer 70B are cut at prescribed positions by, for example, dicing. Thus, individualized semiconductor devices (semiconductor packages) 80b, each of which includes the semiconductor element 30 and chip part 60, are obtained.

When the pseudo wafer 50, first wiring layer 70A, and second wiring layer 70B are individualized, they can be cut at such positions that the part 100 is not included in each individualized semiconductor device 80b.

The semiconductor device 80b can be manufactured through the processes illustrated in FIGS. 7A and 7B and FIG. 13 to FIG. 20. After the process to detach the pseudo wafer 50, illustrated in FIG. 15, has been executed, the support body 10 and adhesive layer 20, from which the pseudo wafer 50 has been detached, can be reused to form a next pseudo wafer 50. Specifically, after the pseudo wafer 50 has been detached from the support body 10 and adhesive layer 20, new posts 130, semiconductor elements 30, chip parts 60, and parts 100 are placed again on the adhesive layer 20 as illustrated in FIG. 13, and a new resin layer 40 is formed as illustrated in FIG. 14 to form a new pseudo wafer 50. Semiconductors 80b are formed similarly from the new pseudo wafer 50 as illustrated in FIG. 15 to FIG. 20.

In the method of manufacturing the semiconductor device 80b in the second embodiment, the pseudo wafer 50 can be easily detached from the adhesive layer 20 by pressing the parts 100 placed on the pseudo wafer 50 through the mutually communicating through-holes 11 and through-holes 21, with damage to the front surface of the pseudo wafer 50 being suppressed. Since execution of processing to lower the adhesion force of the adhesive layer 20 can be suppressed during the detachment of the pseudo wafer 50 from the adhesive layer 20, the adhesive layer 20 can be reused. Therefore, the number of person-hours and costs involved in the manufacturing of the semiconductor devices 80b can be reduced.

The part 100 described above can take various forms.

For example, a technology can also be applied by which frames that enclose a combination of the semiconductor element 30 and other elements are formed on the pseudo wafer 50 to suppress the semiconductor element 30 and other elements from being displaced when the resin layer 40 contracts due to curing and also suppress the pseudo wafer 50 from being deformed. The frames of this type can also be used as the part 100.

Figure 21A:
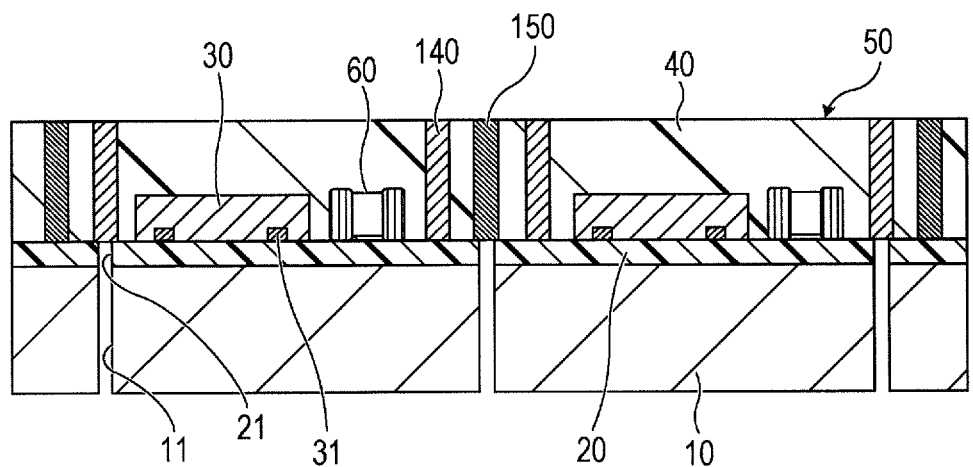
FIGS. 21A and 21B illustrate an example of a pseudo wafer that uses frames.
Figure 21B:
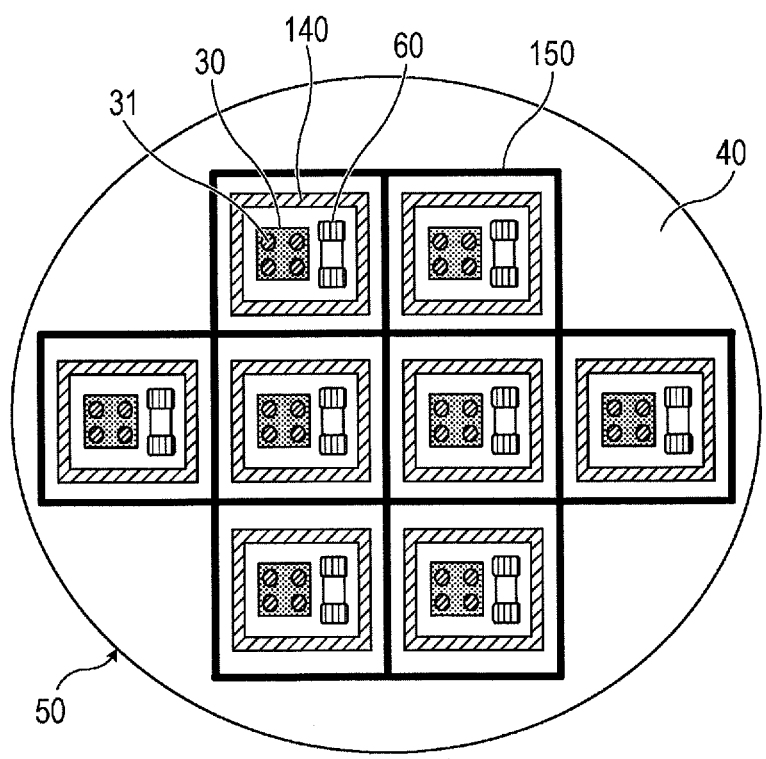

FIGS. 21A and 21B illustrate an example of a pseudo wafer that uses frames. Specifically, FIG. 21A schematically illustrates the cross section of the main elements on an example of a pseudo wafer, formed on the support body 10 and adhesive layer 20, that uses frames, and FIG. 21B is a schematic plan view of the example of the pseudo wafer that uses frames as viewed from the surface, of the pseudo wafer, that is in contact with the adhesive layer 20.

In the description that follows, the pseudo wafer 50 used in the manufacturing of the semiconductor device 80a is used as an example. On the pseudo wafer 50, frames 140 (parts) are placed, each of which encloses a combination of the semiconductor element 30 and chip part 60 and frames 150 (parts) in a grid shape are also placed, each of which has an opening, the frame 140 being placed inside the frame 150, as illustrated in FIGS. 21A and 21B. The frame 140 suppresses the semiconductor element 30 and chip part 60 inside the frame 140 from being displaced when the resin layer 40 contracts due to curing. The frame 150 suppresses the pseudo wafer 50 from being warped or otherwise deformed after the pseudo wafer 50 has been detached from the adhesive layer 20.

As in the case of the part 100 described above, the frame 140 and frame 150 can be formed by using a semiconductor such as silicon, a metal, or the like. The frame 140 and frame 150 are placed on the adhesive layer 20 together with the semiconductor element 30 and chip part 60. The mutually communicating through-hole 11 and through-hole 21 are respectively formed in the support body 10 and adhesive layer 20 in advance in an area in which the frame 140 and frame 150 are to be placed. Thus, when the frame 140 and frame 150 are placed on the adhesive layer 20, the mutually communicating through-holes 11 and through-holes 21 are covered with the frame 140 or frame 150. That is, the frame 140 or frame 150 fulfills the same role as the part 100. To detach the pseudo wafer 50 from the adhesive layer 20, the frame 140 or frame 150, which covers the mutually communicating through-holes 11 and through-holes 21, is pressed by pins or other members.

As described above, the use of frame 140 or frame 150 can also provide the same effect as when the part 100 is used.

When the wiring layer 70 and other elements are formed on the pseudo wafer 50 on which the frame 140 and frame 150 have been placed and the pseudo wafer 50 is then individualized, the pseudo wafer 50 is cut so that the frame 140 remains inside the individualized 80a. Thus, the frame 140 remaining inside the semiconductor device 80a can function as a heat dissipating member that dissipates heat generated from the semiconductor element 30 and the like and can also function as a moisture-resistant member that suppresses moisture from entering the semiconductor element 30 and other elements.

Although the frame 150 in a grid shape has been used as an example, this is not a limitation; the frame 150 may have any shape, other than a grid, that suppresses the pseudo wafer 50 from being warped or otherwise deformed.

Figure 22:
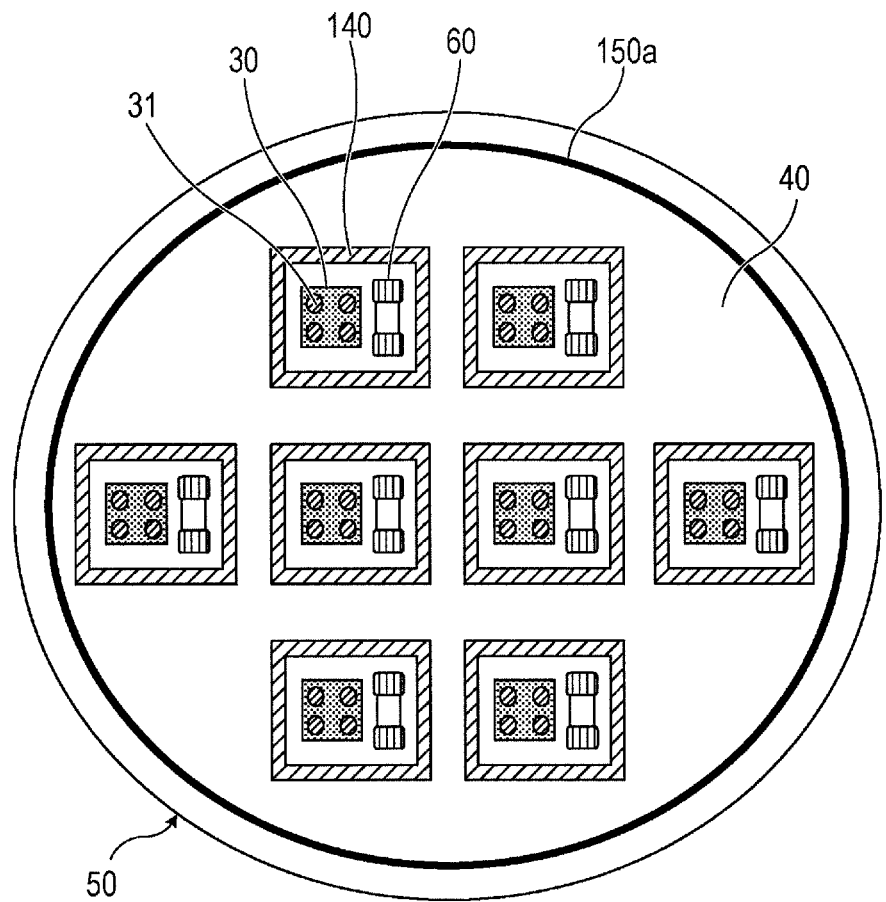
FIG. 22 illustrates another example of a pseudo wafer that uses frames.

FIG. 22 illustrates another example of a pseudo wafer that uses frames. Specifically, FIG. 22 is a schematic plan view of an example of a pseudo wafer that uses frames as viewed from the surface, of the pseudo wafer, that is in contact with the adhesive layer 20.

In addition to the frame 140, which encloses a combination of the semiconductor element 30 and chip part 60, the pseudo wafer 50 illustrated in FIG. 22 has a frame 150a, which is shaped like a ring, on a circumferential end of the pseudo wafer 50 to enclose all the semiconductor elements 30 and chip parts 60 on the pseudo wafer 50.

The mutually communicating through-holes 11 and through-holes 21 can be respectively formed in the support body 10 and adhesive layer 20 in advance in an area in which the ring-shaped frame 150a is to be placed. Thus, when the frame 140 and frame 150a are placed on the adhesive layer 20, the mutually communicating through-holes 11 and through-holes 21 are covered with the frame 150a. To detach the pseudo wafer 50 from the adhesive layer 20, the frame 150a, which covers the mutually communicating through-holes 11 and through-holes 21, is pressed by pins or other members.

The use of frame 150a as described above can also provide the same effect as when the part 100 is used.

Although the pseudo wafer 50 used in the manufacturing of the semiconductor device 80a has been used as an example, a method in which the frame 140 and the frame 150 or frame 150a are used can also be applied similarly to the pseudo wafer 50 used in the manufacturing of the semiconductor device 80b including the posts 130.

The semiconductor device 80a or semiconductor device 80b obtained as described above or the like can be mounted on a circuit board.

Figure 23:
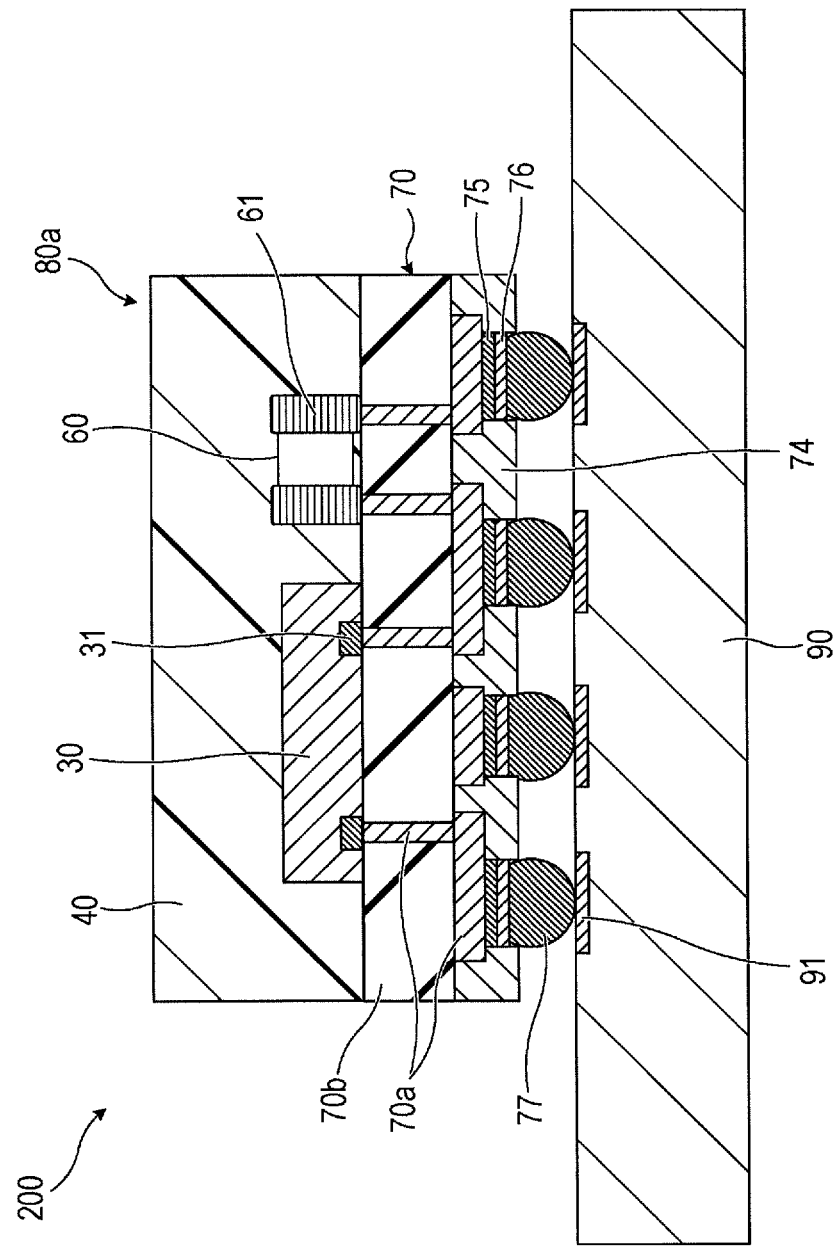
FIG. 23 illustrates an example of an electronic device.

FIG. 23 illustrates an example of an electronic device. Specifically, FIG. 23 schematically illustrates the cross section of the main elements on an example of an electronic device.

The electronic device 200 illustrated in FIG. 23 has the semiconductor device 80a and a circuit board 90. The semiconductor device 80a is mounted on the circuit board 90 so that the semiconductor device 80a is electrically connected to electrode pads 91 on the circuit board 90 through the bumps 77 mounted on the semiconductor device 80a. Thus, the individualized semiconductor device 80a mounted on the circuit board 90 can be used as part of the electronic device 200. When the semiconductor device 80a, which can be formed with less person-hours and at a less cost, is used, the electronic device 200 can be manufactured at a low cost.

Although in the electronic device 200 illustrated as an example in FIG. 23, the semiconductor device 80a in the first embodiment described above is mounted on the circuit board 90, the semiconductor device 80b in the second embodiment described above can also be mounted similarly on the circuit board 90 through bumps such as solder balls. When the semiconductor device 80b is used, it is also possible to further mount another semiconductor device on the semiconductor device 80b mounted on the circuit board 90.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
placing a first semiconductor element on an adhesive layer that is placed on a support body having a first through hole;
placing a first part in an area that includes a portion corresponding to the first through-hole, the portion being on the adhesive layer placed on the support body;
forming a first resin layer on the adhesive layer, on which the first semiconductor element and the first part have been placed, to form, on the adhesive layer, a first substrate that includes the first semiconductor element, the first part, and the first resin layer;
detaching the first substrate from the adhesive layer by pressing the first part through the first through-hole;
placing a second semiconductor element on the adhesive layer, from which the first substrate has been detached;
placing a second part in the area on the adhesive layer, from which the first substrate has been detached;

forming a second resin layer on the adhesive layer, on which the second semiconductor element and the second part have been placed, to form, on the adhesive layer, a second substrate that includes the second semiconductor element, the second part, and the second resin layer; and detaching the second substrate from the adhesive layer by pressing the second part through the first through-hole.

2. The method according to claim 1, wherein:

in the placing the first part, a part that has an uneven spot in a portion that faces the adhesive layer is placed as the first part; and in the placing the second part, a part that has an uneven spot in a portion that faces the adhesive layer is placed as the second part.

3. The method according to claim 1, wherein:

in the placing the first part, a frame that encloses a side of the first semiconductor element on the adhesive layer is placed as the first part; and in the placing the second part, a frame that encloses a side of the second semiconductor element on the adhesive layer is placed as the second part.

4. The method according to claim 1, wherein:

the adhesive layer on the support body has a second through-hole that communicates with the first through-hole; and in the detaching the first substrate from the adhesive layer, the first part is pressed through the first through-hole and the second through-hole to detach the first substrate from the adhesive layer; and in the detaching the second substrate from the adhesive layer, the second part is pressed through the first through-hole and the second through-hole to detach the second substrate from the adhesive layer.

5. The method according to claim 1, wherein an adhesive force of the adhesive layer in a direction in which the first substrate and the second substrate are detached is weaker than an adhesive force of the adhesive layer in a surface direction in which the first substrate and the second substrate are formed.

* * * * *